(12) United States Patent
Noda et al.

(10) Patent No.: US 8,356,951 B2
(45) Date of Patent: Jan. 22, 2013

(54) WET-PROCESSING APPARATUS

(75) Inventors: Yasuaki Noda, Koshi (JP); Akira Fukutomi, Koshi (JP); Takafumi Hayama, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 76 days.

(21) Appl. No.: 13/105,040

(22) Filed: May 11, 2011

(65) Prior Publication Data

US 2011/0286738 A1 Nov. 24, 2011

(30) Foreign Application Priority Data

May 21, 2010 (JP) ................................ 2010-116905
Feb. 10, 2011 (JP) ................................ 2011-027020

(51) Int. Cl.
*G03D 5/00* (2006.01)

(52) U.S. Cl. ..................................................... 396/611

(58) Field of Classification Search .................... 396/611
See application file for complete search history.

(56) References Cited

U.S. PATENT DOCUMENTS

| | | | |
|---|---|---|---|
| 7,752,999 B2 | 7/2010 | Nakashima et al. | |
| 2004/0173144 A1* | 9/2004 | Edwards et al. | 118/300 |
| 2005/0037269 A1* | 2/2005 | Levinson | 430/30 |
| 2008/0274670 A1* | 11/2008 | Tada et al. | 451/6 |
| 2010/0002206 A1* | 1/2010 | Kida et al. | 355/30 |
| 2010/0098869 A1* | 4/2010 | Kinoshita | 427/421.1 |

FOREIGN PATENT DOCUMENTS

JP 2008-135679 A1 6/2008

* cited by examiner

*Primary Examiner* — Rodney Fuller
(74) *Attorney, Agent, or Firm* — Burr & Brown

(57) ABSTRACT

A wet-processing apparatus, which spouts a coating liquid onto a surface of a substrate, includes: nozzles provided with passages for the coating liquid; a light source which illuminates an area between a plane containing the tips of the nozzles and the surface of the substrate; a camera for forming an image of the area; a control unit which provides a spout signal requesting spouting the liquid from the nozzle toward the substrate, and an imaging signal requesting the camera to start an imaging operation; and a decision unit which decides whether or not the liquid was spouted from the nozzle and whether or not changes occurred in the condition of the liquid spouted from the nozzle toward the substrate on the basis of an image formed by the camera and expressing the brightness of the liquid spouted toward the substrate and illuminated by light emitted by the light source.

17 Claims, 21 Drawing Sheets

WET-PROCESSING APPARATUS

BACKGROUND OF THE INVENTION

1. Technical Field

The present invention relates to a wet-processing apparatus which processes substrates, such as semiconductor wafers or glass panels for liquid crystal displays (LCD panels), by spouting processing liquids, such as resist solutions and developers from processing liquid spouting nozzles onto substrates.

2. Description of the Related Art

Generally, a resist pattern forming method, namely, one of methods of fabricating semiconductor devices and LCD panels, forms a resist pattern on a substrate or a semiconductor wafer (hereinafter referred to simply as "wafer") by a series of processes for forming a resist film on the wafer, and developing the resist film exposed through a photomask. Usually, the series of processes are carried out by a coating and developing apparatus.

The coating and developing apparatus is provided with wet-processing units including coating units for resist solution application, and developing units for processing a wafer processed by an exposure process by a developing process. The coating units and the developing units are used to attain a high throughput.

A coating unit for coating a wafer with, for example, a resist solution has a spin chuck, namely, a substrate holder, and a splash cup surrounding the spin chuck. The resist solution is spouted onto a substantially central part of a wafer held by the spin chuck. The spin chuck is rotated for spin coating and centrifugal drying. The wafer coated with the resist solution is subjected to side rinsing.

Since most resist solutions used as coating liquids are expensive, it is desired to reduce the amount of the resist solution necessary for coating a wafer to the least possible extent. For example, it is required to coat a 300 mm-diameter substrate with not more than 1 cm$^3$ of the resist solution. Since such a small amount of the resist solution is spouted in a short time, it is difficult to measure the amount of the spouted resist solution by a flowmeter. A recent coating and developing apparatus is built so as to occupy a small floor space and the component units thereof are stacked vertically in layers. Consequently, only small spaces are available for maintenance work and visual inspection. It is difficult to perceive failure in spouting the resist solution and faulty resist solution spouting under such severe spatial and operational conditions. If the perception of such an abnormal processing condition is delayed, it is possible that a large amount of unacceptable substrates are produced by defective processes.

A technique to cope with such a problem is proposed in JP-A 2008-135679 (Patent document 1). This technique illuminates the tip of a nozzle with light emitted by a light source, such as an LED lamp, forms an image of the tip of the nozzle by a camera to obtain image data on the tip of the nozzle, and analyzes the image data to find out a faulty condition, such as the dripping of the coating liquid from the nozzle.

SUMMARY OF THE INVENTION

The technique mentioned in JP-A 2008-135679 forms an image of the tip of the nozzle by a camera and analyzes image data on the image. Therefore, it is difficult for this technique to decide whether or not the coating liquid was spouted from the nozzle and whether or not changes occurred in the condition of the coating liquid spouted from the nozzle onto a substrate, such as bubbling resulting from inclusion of gas in the coating liquid and the narrowing of a column of the spouted coating liquid, occurred at an early stage.

The present invention has been made under such circumstances and it is therefore an object of the present invention to provide a wet-processing apparatus capable of accurately deciding whether or not the coating liquid was spouted from the nozzle and whether or not changes occurred in the condition of the coating liquid spouted from the nozzle toward a substrate.

The present invention provides a wet-processing apparatus which processes a substrate horizontally held by a substrate holder by a wet process that spouts processing liquids supplied by a processing liquid supply system onto a surface of the substrate, including: processing liquid spouting nozzles respectively for spouting the processing liquids supplied by the processing liquid supply system; a light source for illuminating an area between a plane containing tips of the processing liquid spouting nozzles and the surface of the substrate; an imaging device for forming an image of at least the area between the plane containing the tips of the processing liquid spouting nozzles and the surface of the substrate in an area including the processing liquid spouting nozzles and the surface of the substrate; a control unit which provides a spout signal requesting spouting the processing liquid from the processing liquid spouting nozzle toward the substrate, and an imaging signal requesting the imaging device to start an imaging operation; and a decision unit which decides whether or not the processing liquid was spouted from the processing liquid spouting nozzle and whether or not changes, such as bubbling resulting from inclusion of gas in the processing liquid, dripping of the processing liquid, narrowing of a column of the processing liquid and change in the duration of spouting the processing liquid, occurred in the condition of the processing liquid spouted from the processing liquid spouting nozzle on the basis of an image formed by the imaging device and expressing the luminous intensity of light emitted by the light source, and penetrated into and reflected by the processing liquid spouted toward the substrate.

Since the light source illuminates the area between the tip of the processing liquid spouting nozzle and the surface of the substrate, a column of the processing liquid spouted from the processing liquid spouting nozzle toward the substrate reflects the light emitted by the light source and shines in a brightness. The imaging device forms an image of the processing liquid column shining in the brightness. The decision unit can decide whether or not the processing liquid was spouted from the nozzle and whether or not changes in the condition of the processing liquid spouted from the nozzle toward the substrate, such as bubbling resulting from inclusion of gas in the processing liquid, dripping of the processing liquid, narrowing of the processing liquid column and change in the duration of spouting the processing liquid, occurred on the basis of the image formed by the imaging device.

Since only the area between the tip of the processing liquid spouting nozzle and the surface of the substrate is illuminated, unnecessary reflection of light from the directly illuminated processing liquid spouting nozzle and such can be suppressed. Consequently, the image can be formed in improved accuracy.

Desirably, the light source emits light toward the surface of the substrate such that the light is reflected by the surface of the substrate and the reflected light illuminates the area between the plane containing the tips of the processing liquid spouting nozzles and the surface of the substrate or the light source emits light toward a position on the substrate where the processing liquid spouted from the processing liquid spouting nozzle falls.

When the light source thus emits light, the imaging device can form an image expressing the brightness of the processing liquid column in improved accuracy because the imaging device does not receive the light reflected from the surface of the substrate.

The imaging device may be disposed with its optical axis aligned with a light path of the reflected light reflected from a point of incidence of the light emitted by the light source on a processing liquid column in a direction at a reflection angle to a normal at the point of incidence on the processing liquid column equal to an incident angle to the normal at the point of incidence.

When the imaging device is thus disposed, the imaging device can receive the reflected light on the optical path of a part having the highest brightness of the reflected light reflected from the processing liquid column and hence can form an image in improved accuracy.

Desirably, the processing liquid spouting nozzles are tubular bodies made of a transparent material, and the imaging device is capable of forming an image expressing the brightness of the processing liquid in a passage formed in each processing liquid spouting nozzle.

When the processing liquid spouting nozzles are transparent, the imaging device can form an image expressing the intensity of the light reflected from the processing liquid in the passage formed in the processing liquid spouting nozzle. Therefore, the decision unit can make a decision on the basis of both the image of the area between the tip of the processing liquid spouting nozzle and the surface of the substrate and the image of the processing liquid in the passage of the processing liquid spouting nozzle. Thus, whether or not the processing liquid was spouted from the nozzle and whether or not changes occurred in the condition of the processing liquid spouted from the nozzle toward a substrate can be decided in improved accuracy.

Desirably, the wet-processing apparatus according to the present invention further includes a storage device storing reference data to be used for deciding whether or not the processing liquid was spouted from the nozzle and whether or not changes occurred in the condition of the processing liquid spouted from the nozzle toward a substrate, and the decision unit decides whether or not the processing liquid was spouted from the nozzle and whether or not changes occurred in the condition of the processing liquid spouted from the nozzle toward a substrate on the basis of the result of comparison of the image formed by the imaging device and the reference data in terms of lightness. The reference data may be an image of the processing liquid normally spouted from the processing liquid spouting nozzle formed by the imaging device.

Thus, the decision unit can decide whether or not the processing liquid was spouted from the nozzle and whether or not changes occurred in the condition of the processing liquid spouted from the nozzle toward a substrate in improved accuracy.

The wet-processing apparatus according to the present invention may further include a nozzle carrying mechanism for carrying the processing liquid spouting nozzles to a position above the substrate held by the substrate holder, the processing liquid spouting nozzles may be arranged in a row parallel to a straight line, and a single light source may emit a flat light beam toward the area between a plane containing the tips of the processing liquid spouting nozzles and the surfaces of the substrates or light sources respectively corresponding to the processing liquid spouting nozzles and arranged on a straight line parallel to the row of the processing liquid spouting nozzles may emit light.

The light source may include a first light source and a second light source, and the first and the second light source are disposed symmetrically with respect to the vertical axis of the processing liquid spouting nozzle such that an angle in a horizontal plane between the optical axis of the imaging device and that of each of the first and the second light source is in the range of 120° to 160°.

If the first and the second light source are placed at an angular distance in a horizontal plane smaller than 120° from the imaging device, the brightness of the processing liquid column is low, the processing liquid column is inconspicuous. If the first and the second light source are placed at an angular distance in a horizontal plane greater than 160° from the imaging device, the respective luminous intensities of reflected light reflected from the processing liquid column toward the imaging device and refracted light refracted by the processing liquid column and traveling toward the imaging device are low and hence the processing liquid column is inconspicuous.

When the first and the second light source are disposed properly as mentioned above, the first and the second light source disposed opposite with respect to the imaging device emit light toward the processing liquid spouting nozzle. Consequently, the reflected and the refracted light of high luminous intensities travels from the side of the processing liquid column spouted onto the substrate toward the imaging device, the side of the processing liquid column shines in a high brightness, and the processing liquid column is conspicuous, which improves the accuracy of an image formed by the imaging device.

The imaging device and the light source may be disposed opposite with respect to the processing liquid spouting nozzle, and an auxiliary light source may be disposed opposite the light source with respect to the processing liquid spouting nozzle.

When the imaging device, the light source and the auxiliary light source are disposed in the foregoing positional relation, a part on the side of the imaging device of the surface of the processing liquid column spouted toward the substrate can be illuminated in a high brightness and the same is conspicuous, which improves the accuracy of an image formed by the imaging device.

Desirably, the processing liquid spouting nozzles are tubular bodies made of a transparent material and the imaging device is capable of forming an image expressing the brightness of the processing liquid in a passage formed in each processing liquid spouting nozzle.

When the wet-processing apparatus is thus constructed, the imaging device can form an image expressing the brightness of the processing liquid in the passage formed in the processing liquid spouting nozzle, and the decision unit can make a decision on the basis of not only the image of the area between the tip of the processing liquid spouting nozzle and the surface of the substrate, but also the image of the processing liquid in the passage of the processing liquid spouting nozzle. Therefore, whether or not the processing liquid was spouted and whether or not changes occurred in the condition of the processing liquid spouted from the processing liquid spouting nozzle can be decided in improved accuracy.

The light source illuminates the processing liquid spouting nozzles also, and the decision unit decides whether or not there is any change in the level of the surface of the processing liquid in the passage of each processing liquid spouting nozzle on the basis of an image of the processing liquid in the passage of the processing liquid spouting nozzle formed by the imaging device and expressing the brightness of the processing liquid in the passage.

When the wet-processing apparatus is thus constructed, a change in the level of the surface of the processing liquid in the passage of the processing liquid spouting nozzle, such as a rise or a descent of the surface of the processing liquid held in the passage of the processing liquid spouting nozzle from a predetermined level and a change in the shape of the surface of the processing liquid can be detected. The predetermined level is the level of the surface of the processing liquid sucked back into the passage of the processing liquid spouting nozzle in a state after the completion of spouting.

Desirably, the light source is disposed at a level higher than the predetermined level of the surface of the processing liquid in the passage of the processing liquid spouting nozzle such that an angle in a vertical plane between a light path of light from the light source to a point on the surface of the processing liquid at the predetermined level and a light path of reflected light from the same point on the surface of the processing liquid to the imaging device is in the range of 120° to 160°.

If the angle in a vertical plane between the light path of light from the light source to a point on the surface of the processing liquid at the predetermined level and the light path of reflected light from the same point on the surface of the processing liquid to the imaging device is smaller than 120°, the respective luminous intensities of the reflected light and refracted light traveling toward the imaging device are low and hence a clear image of the surface of the processing liquid cannot be formed. If the angle in a vertical plane between the light path of light from the light source to a point on the surface of the processing liquid at the predetermined level and the light path of reflected light from the same point on the surface of the processing liquid to the imaging device is greater than 160°, the brightness of the illuminated surface of the processing liquid is low and hence a clear image of the surface of the processing liquid cannot be formed.

The light source and the imaging device are disposed in the angular relation as mentioned above to illuminate the surface of the processing liquid held in the passage of the processing liquid spouting nozzle with both light directly fallen on the surface of the processing liquid and light reflected from the surface of the substrate toward the surface of the processing liquid. Consequently, the respective luminous intensities of reflected light and refracted light traveling from the surface of the processing liquid toward the imaging device are enhanced, so that the surface of the processing liquid shines in a high brightness, the surface of the processing liquid is stably conspicuous and an image of the surface of the processing liquid can be formed in improved accuracy.

The wet-processing apparatus of the present invention can accurately decide whether or not the processing liquid was spouted from the processing nozzle spouting nozzle and whether or not changes occurred in the condition of the processing liquid spouted from the processing liquid spouting nozzle.

DESCRIPTION OF THE PREFERRED EMBODIMENTS

First Embodiment

A coating unit as a first embodiment of a wet-processing apparatus according to the present invention will be described. The coating unit applies a resist solution, namely, a processing liquid, namely, a substrate, and a thinner for facilitating the spread of the resist solution over the surface of a wafer W to the surface of the wafer W. In the following description, the resist solutions and the thinner will be designated inclusively as a coating liquid R. The outline of the construction of the coating unit will be described.

Figure 1:
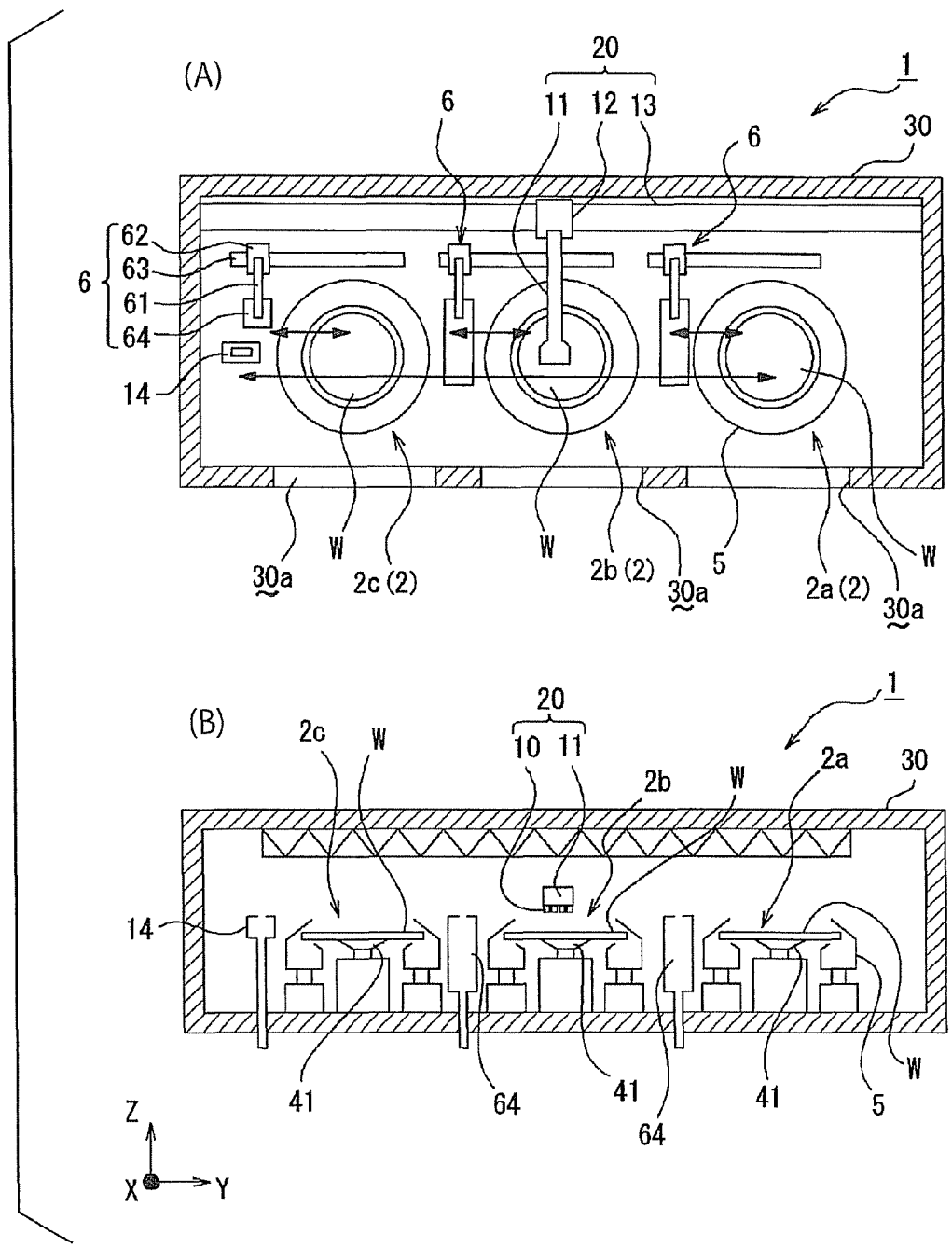
FIGS. 1A and 1B are a horizontal sectional view and a vertical sectional view, respectively, of a coating unit as a wet-processing apparatus in a first embodiment according to the present invention.

Referring to FIG. 1, a coating unit 1 in a first embodiment according to the present invention has three wet-processing devices 2a, 2b and 2c arranged in a lateral row parallel to the Y-axis in a box-shaped housing 30, a plurality of processing liquid spouting nozzles 10 (hereinafter referred to simply as "nozzles 10"), for supplying the coating liquids R, such as a resist solution and thinner, to the wet-processing devices 2a, 2b and 2c, a nozzle carrying mechanism 20 for carrying the nozzles 10, a nozzle bath 14 for holding the nozzles 10 therein, and an edge bead remover 6 (hereinafter referred to as "EBR 6") for removing a peripheral part of a resist film coating a wafer W.

The wet-processing devices 2a, 2b and 2c are the same in construction. Each of the wet-processing devices 2a, 2b and 2c has a spin chuck 41, namely, a substrate holder, and a splash cup 5 surrounding a wafer W held by the spin chuck 41. In the following description, the wet-processing devices 2a, 2b and 2c will be represented by the wet-processing device 2.

Figure 2:
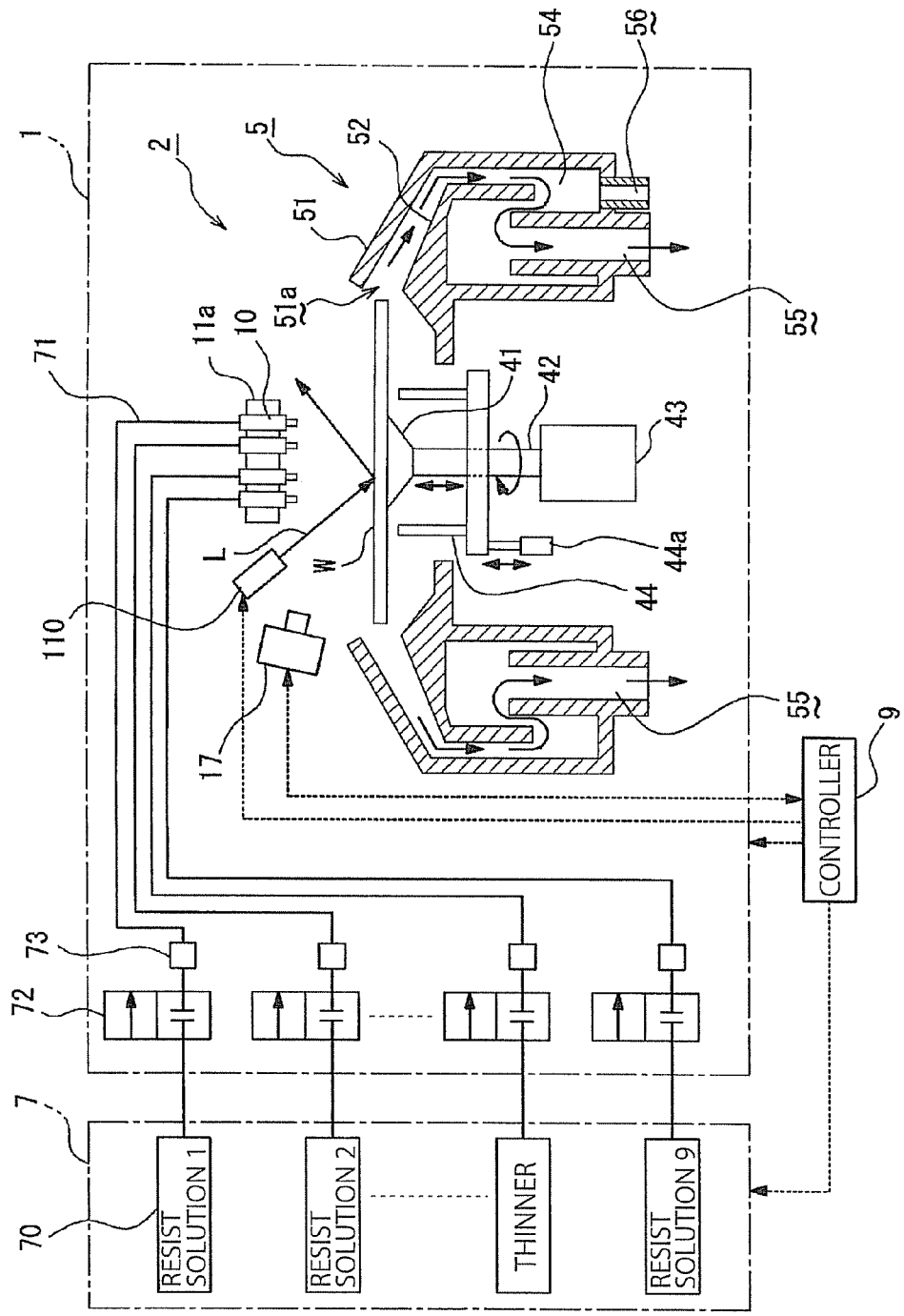
FIG. 2 is a schematic sectional view of a processing device and a processing liquid supply system included in the coating unit shown in FIG. 1.

The spin chuck 41 serves as a substrate holder that attracts a wafer W by its lower central part by suction and holds the wafer W in a horizontal position. As shown in FIG. 2, the spin chuck 41 is connected to a driving mechanism 43, namely, a spin chuck motor, by a spindle 42. The spin chuck 41 holding a wafer W can rotate and move vertically. Lifting pins 44 are arranged around the spin chuck 41. The lifting pins 44 are moved vertically by a lifting mechanism 44a to move the wafer W held on the spin chuck vertically. A wafer W carried into the housing 30 by a carrying arm A3, namely, a carrying means, is transferred from the carrying arm A3 to the spin chuck 41 by cooperative operations of the carrying arm A3 and the lifting pins 44. A wafer W is carried by the carrying arm A3 into the housing 30 through one of openings 30a formed in a wall of the housing 30 as shown in FIG. 1A.

The splash cup 5 stops mist scattered by a wafer W rotating for spin coating from flying in the housing 30. The mist collected by the splash cup 5 is discharged from the coating unit 1. As shown in FIG. 2, the splash cup 5 has a first ring 51 having a tapered upper part, and a second ring 52. A space between the rings 51 and 52 serves as a fluid passage 51a through which a fluid containing the mist scattered by the wafer W flows. A sump 54 having the shape of a U-shaped annular groove and provided with a drain port 56 forms the bottom of the splash cup 5. The liquid scattered by the wafer W is guided toward the sump 54 and is drained through the drain port 56. The fluid flowing through the fluid passage 51a is discharged through a discharge port 55 into an exhaust duct, not shown. The exhaust duct carries the fluid outside the housing 30.

The nozzles 10 and the nozzle carrying mechanism 20 will be described. The coating unit 1 is provided with the eleven nozzles 10. Each of the nozzles 10 is used for spouting the coating liquid R onto the wafer W held by the spin chuck 41. The eleven nozzles 10 are used for spouting ten kinds of resist solutions respectively having different compositions and different resist concentrations, and thinner for facilitating the spread of the resist solution over the surface of the wafer W, respectively. In FIGS. 1A and 2, only some of the eleven nozzles are shown for convenience. The coating unit 1 is provided with the ten nozzles 10 respectively for spouting ten kinds of resist solutions and the one nozzle 10 for spouting the thinner. However, if a wet-processing apparatus uses only one kind of processing liquid, the wet-processing apparatus may be provided with only one nozzle.

As shown in FIG. 1A, the nozzle carrying mechanism 20 has a nozzle support arm 11 for supporting the nozzles 10, a base 12 supporting the nozzle support arm 11, a guide rail 13 for guiding the base 12, and a driving mechanism 15 (FIG. 4) for driving the base 12 for movement along the guide rail 13.

Figure 3:
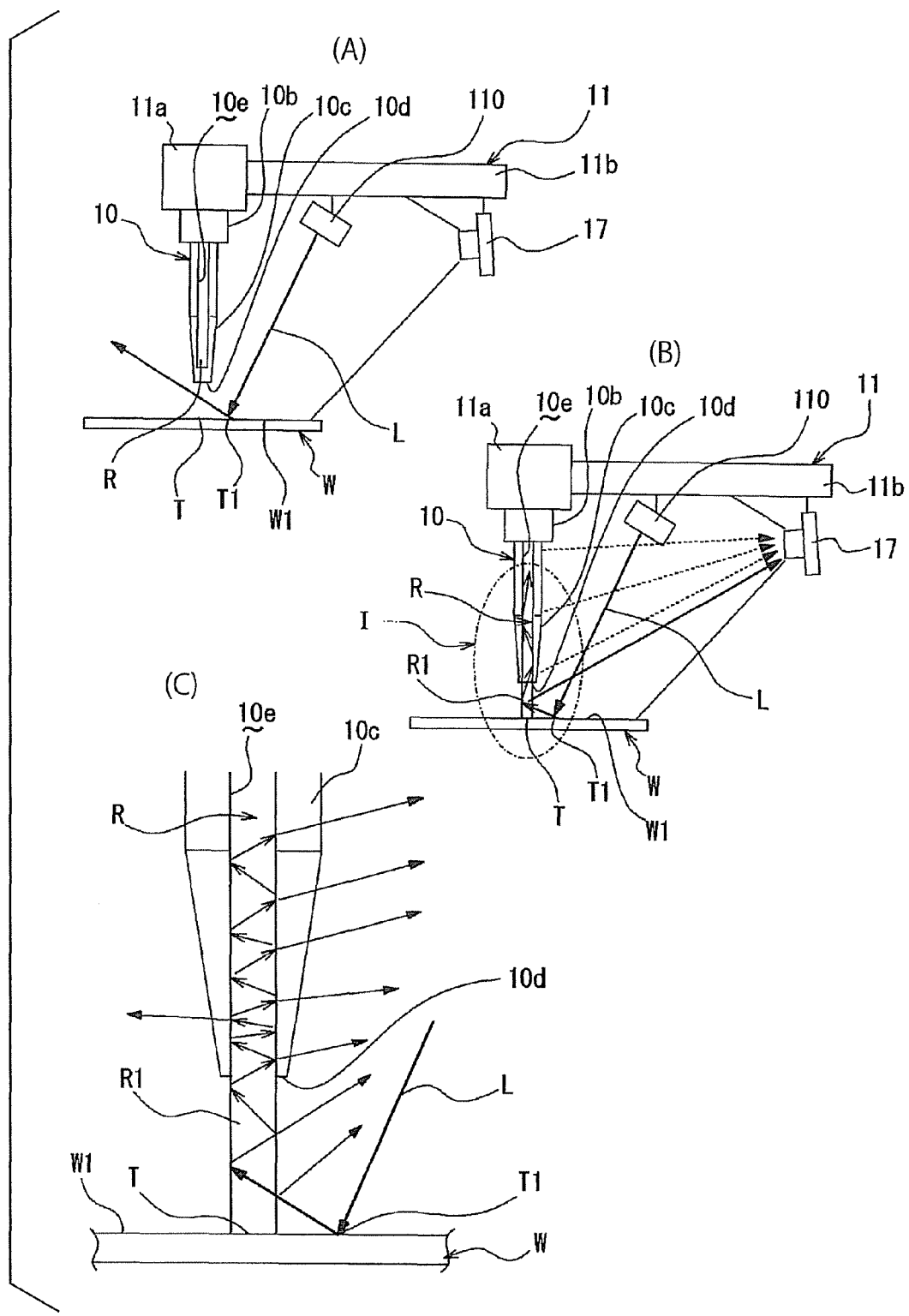
FIGS. 3A and 3B are side elevations of a processing liquid spouting nozzle included in the coating unit in the first embodiment at a position above a substrate and in a spouting operation, respectively.
FIG. 3C is an enlarged sectional view of a part of FIG. 3B.
Figure 5:
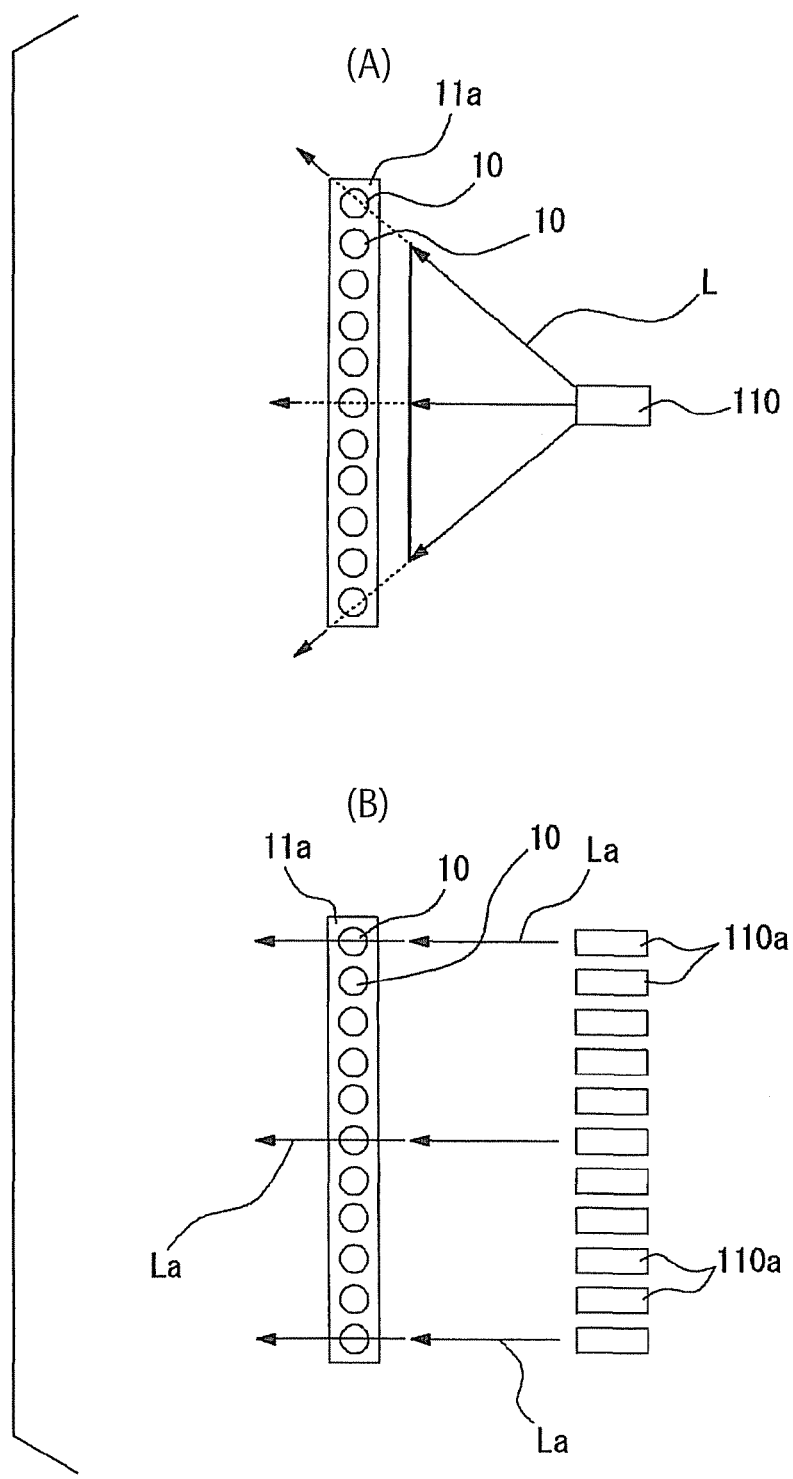
FIGS. 5A and 5B are schematic plan views of an arrangement including a plurality nozzles and a single light source for illuminating all the nozzles, and an arrangement including a plurality of nozzles and a plurality of light sources respectively corresponding to the nozzles, respectively.

Referring to FIGS. 3A and 5A, the nozzle support arm 11 has a nozzle head 11a holding the eleven nozzles 10, and an arm 11b supporting the nozzle head 11a. Pockets in which base parts 10b of the nozzles 10 can be fitted are formed in the lower surface of the nozzle head 11a. The nozzles 10 can be attached to the nozzle head 11a simply by fitting the base parts 10b of the nozzles 10 in the pockets. The eleven nozzles 10 are arranged in a row on the nozzle head 11a with their tips 10d facing down. The row of the nozzles 10 is parallel to nozzle moving directions in which the nozzles 10 are moved as shown in FIG. 1A. Coating liquid supply pipes 71 connected to a coating liquid supply unit 7 are connected to a base part of the nozzle head 11a. The coating liquids R can be supplied to the nozzles 10 through passages formed in the nozzle head 11a.

The arm 11b is a support member extending between the nozzle head 11a and the base 12 such that the nozzles 10 can move above a substantially central part of the wafer W held by the spin chuck 41. The base 12 is connected to the driving mechanism 15. The base 12 is moved along the guide rail 13 to move the nozzle support arm 11 in directions parallel to the Y-axis shown in FIG. 11B. The base 12 is provided with a lifting mechanism, not shown, and the base end of the arm 11b is connected to the lifting mechanism. The nozzle support arm 11 can be vertically moved in directions parallel to the Z-axis.

The nozzle head 11a is moved so as to locate the desired one of the nozzles 10 above a substantially central part of the wafer W. Thus, the coating liquid R can be spouted onto the wafer W.

The EBR 6 spouts a rinsing solution capable of resolving a resist film and removes a peripheral part of a resist film formed on the wafer W by rinsing to prevent a peripheral part of the resist film from coming off. As shown in FIG. 1A, the EBR 6 has a an EBR arm 61 holding a rinsing nozzle that spouts the rinsing solution, a movable base 62 supporting the EBR arm 61, a guide rail 63 along which the base 62 moves, and an EBR nozzle bath 64 in which the rinsing nozzle is held at a home position when the EBR 6 is not used.

The coating liquid supply unit 7 for supplying the coating liquid R to the nozzle 10 will be described with reference to FIG. 2. The coating liquid supply unit 7 has coating liquid supply mechanisms 70. Each coating liquid supply mechanism 70 includes a storage tank, not shown, storing the coating liquid R, and a pressurizing unit, not shown, for pressurizing the storage tank by supplying a gas into the storage tank to force the coating liquid R to flow into the coating unit 1. The number of the coating liquid supply mechanisms 70 is equal to the number of the different kinds of coating liquids R.

The coating liquid supply mechanism 70 is connected to the nozzle 10 by the coating liquid supply pipe 71 provided with an on-off pneumatic valve 72 and a suck-back valve 73. The on-off pneumatic valve 72 either allows the coating liquid R to flow through the coating liquid supply pipe 71 or stops the coating liquid R flowing through the coating liquid supply pipe 71. The suck-back valve 73 pulls back the coating liquid R from the tip of the nozzle 10 when the coating liquid R is not spouted. Thus, the ten kinds of coating liquids and the thinner can be selectively supplied.

As shown in FIG. 2, A controller 9 is connected to the coating unit 1 and the coating liquid supply unit 7. The controller 9 controls all the operations of the wet-processing apparatus including the coating unit 1 and the component instruments and devices of the wet processing apparatus.

Operations of the coating unit 1 for coating wafers W with the coating liquid R will be briefly described. An external carrying device carries a wafer W through one of the openings 30a into the housing 30. The lifting pins 44 is lifted up to receive the wafer W from the carrying device, the carrying devices moves outside the housing 30, and then the lifting pins 44 are lowered to transfer the wafer W to the spin chuck 41 of the wet-processing device 2 corresponding the opening 30a through which the wafer W was carried into the housing 30.

The nozzle carrying mechanism 20 is actuated. Then, the nozzle carrying mechanism 20 lifts up the nozzles 10 held at the home position in a thinner atmosphere in the nozzle bath 14 and moves the nozzle support arm 11 in the direction parallel to the Y-axis. The nozzle arm 11 is stopped upon the arrival of the nozzle 10 for spouting the thinner at a position above a substantially central part of the wafer W, and then the nozzle support arm 11 is lowered. After the thinner has been spouted from the nozzle 10 onto the stationary wafer W, the nozzle support arm 11 is moved to locate the nozzle 10 for spouting the desired resist solution above a substantially central part of the wafer W. At the same time, the spin chuck 41 is rotated at a high rotating speed, the resist solution is spouted in a moment onto the rotating wafer W and the spouting of the resist solution is stopped. The resist solution spouted onto the rotating wafer W is spread radially for spin coating.

Subsequently, the spin chuck 41 is rotated at a low rotating speed to form a resist film of a uniform thickness. Then, the spin chuck 41 is rotated at a high rotating speed to dry the resist film by centrifugal drying. Meanwhile, the nozzle carrying mechanism 20 moves the nozzle support arm 11 in the reverse direction to the nozzle bath 14. The nozzles 10 are held in the nozzle bath 14 to suppress the drying of the resist solution wetting the nozzles 10.

After the resist film has been dried by centrifugal drying, the EBR 6 is actuated to remove part of the resist film formed on a peripheral part of the wafer W.

Operations executed for carrying the wafer W to the spin chuck 41 are reversed to carry out the wafer W coated with the resist film from the housing 30 by the carrying mechanism. Wafer carrying cycles are carried out to deliver wafers W sequentially at time intervals of, for example, 24 s to all the wet-processing devices 2 and the wafers W are subjected to the same coating process.

The coating unit 1 includes, in addition to the foregoing components, a laser light source 110, namely, a light source that illuminates an area between a plain containing the tips 10d of the nozzles 10 and a surface W1 of a wafer W with a laser beam L, a camera 17, such as a CCD camera, namely, an imaging device, that forms an image of the nozzles 10 and an area between the tips 10d of the nozzles 10 and the surface W1 of the wafer W, a control unit 9a that provides a spout signal requesting the nozzle 10 to spout the coating liquid R onto the wafer W and a imaging signal requesting the camera 17 to start an image forming operation, and a decision unit 9b that decides whether or not the coating liquid was spouted from the nozzle 10 and whether or not changes in the condition of the coating liquid spouted from the nozzle 10 occurred on the basis of an image of the coating liquid R spouted from the nozzle 10 formed by the camera 17 and expressing the brightness of the coating liquid R spouted from the nozzle 10. Those components will be described below.

Referring to FIG. 3A, the camera 17 is held on the nozzle support arm 11 of the nozzle carrying mechanism 20 by a bracket. The camera 17 forms an image of the nozzles 10 from a direction substantially perpendicular to the row of the nozzles 10 held on the nozzle head 11a. The camera 17 is provided with, for example, a wide-angle lens and has a wide imaging field containing all the nozzles 10 and an area between the tips 10d of the nozzles 10 and the surface W1 of the wafer W. The camera 17 may be an image sensor of a CCD type or a CMOS type. The camera 17 does not necessarily need to be fixed to the nozzle support arm 11.

Referring to FIGS. 3A and 3B, the laser light source 110 that illuminates an area between a plane containing the tips 10d of the nozzles 10 and the surface W1 of the wafer W with laser beam L is disposed between the nozzles 10 attached to the lower surface of the nozzle head 11a and the camera 17. The laser light source 110 is, for example, a semiconductor laser. The highly directive laser beam L can accurately illuminate only the area between the plane containing the tips 10d of the nozzles 10 and the surface W1 of the wafer W. The laser light source 110 is provided with an angle adjuster, not shown, to adjust the angle of direction of the laser beam L. Light emitted by an LED light source and condensed by a condenser may be used instead of the laser beam L.

As shown in FIG. 5A the eleven nozzles 10 arranged in a row are held on the nozzle head 11a and the area between a plane containing the tips 10d of all the nozzles 10 and the laser beam L illuminates the surface W1 of the wafer W linearly. The laser beam L is emitted in the direction of the arrows shown in FIG. 5A.

Referring to FIGS. 3A to 3C, each of the nozzles 10 held on the nozzle head 11a of the nozzle support arm 11 is a tubular member having a base part 10b and a tubular part 10c. The base part 10b can be attached to the nozzle head 11a of the nozzle support arm 11. A passage 10e through which the coating liquid R flows is formed through the nozzle 10. The coating liquid R supplied through the supply passage formed in the nozzle arm 11 can be spouted from the tip 10d of the nozzle 10 toward the wafer W. The tubular part 10c of the nozzle 10 is made of a transparent material, such as quartz or a transparent resin. Light irregularly reflected in the coating liquid R filling the passage 10e of the nozzle 10 can travel outside through the tubular part 10c of the nozzle 10.

The coating unit 1 is provided with the eleven nozzles 10 for spouting the ten kinds of resist solutions respectively having different compositions and different resist concentrations, and the thinner for facilitating the spread of the resist solution over the surface W1 of the wafer W. The coating liquids R have different reflectivity values dependent on their concentrations and compositions, respectively. The respective reflectivity values of the coating liquids R are measured beforehand and the measured reflectivity values are stored as reference data in a storage device 95.

As shown in FIG. 2, the camera 17 is connected through an A/D converter, not shown, to the controller 9. The decision unit 9b of the controller 9 decides whether or not the coating liquid R was spouted from the nozzle 10 and whether or not changes occurred in the condition of the coating liquid R spouted from the nozzle 10 toward the wafer W on the basis of an image formed by the camera 17. Result of the decision is displayed on the screen of a display console 8.

Figure 4:
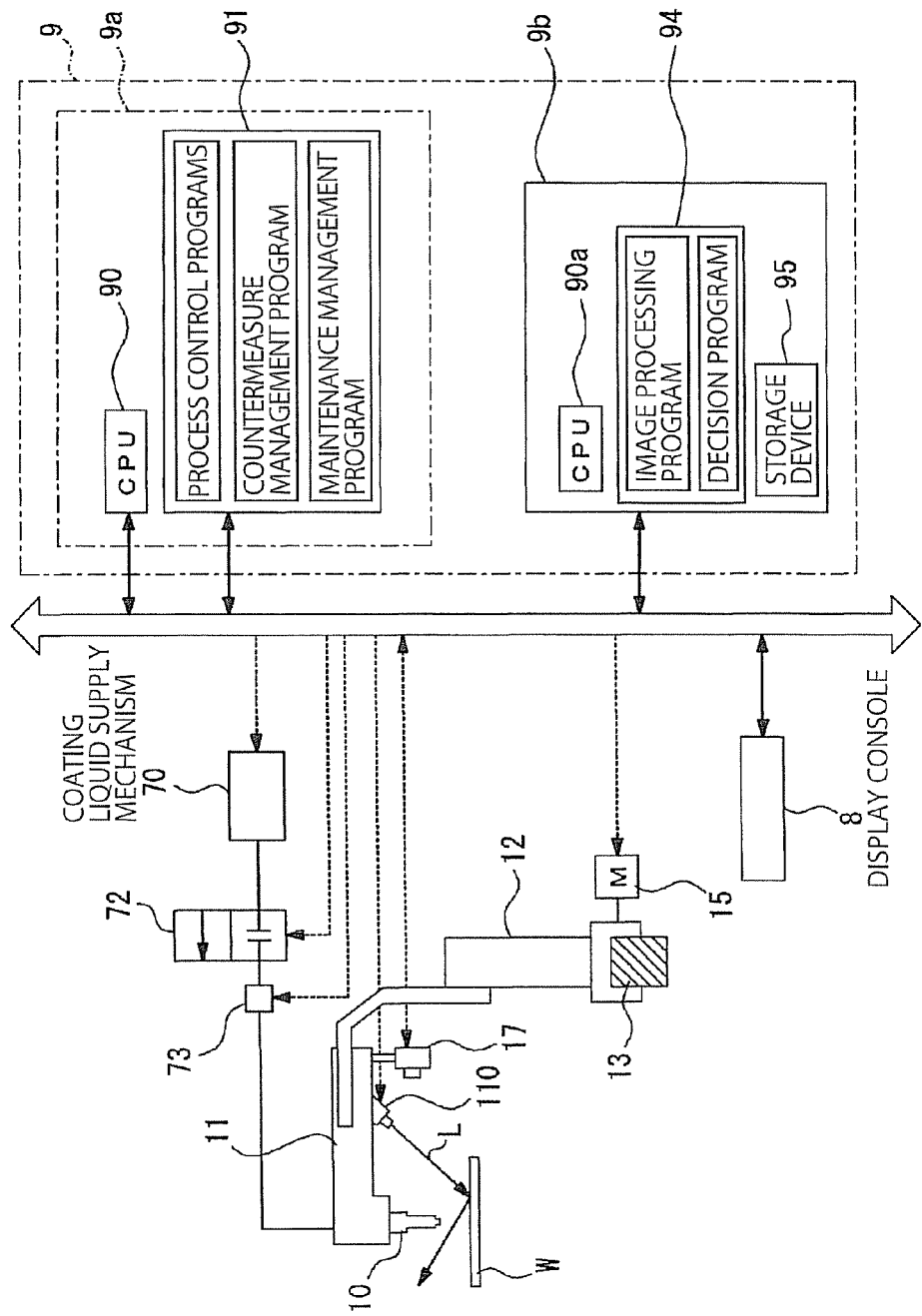
FIG. 4 is a block diagram of an electric system included in the coating unit shown in FIG. 1.

Referring to FIG. 4, the controller 9 includes the control unit 9a for generally controlling the coating an developing apparatus including the coating unit 1, and the decision unit 9b that decides whether or not the coating liquid R was spouted from the nozzle and whether or not changes occurred in the condition of the coating liquid R spouted from the nozzle 10 toward the wafer W.

The control unit 9a is a computer including a central processing unit (CPU) 90 and a program storage device 91. The program storage device 91 stores control programs, namely, process control programs, consisting of sets of instructions to be executed by the computer for controlling operations of the camera 17, the driving mechanism 15 for driving the nozzle carrying mechanism 20, the coating liquid supply mechanisms 70, the pneumatic valves 72, the suck-back valves 73, the laser light source 110. Computer programs, such as a countermeasure management program and a maintenance management program, including sets of instructions to be executed to actuate the component parts of the coating unit 1 and the coating liquid supply unit 7 on the basis of information about whether or not the coating liquid R was spouted independently provided by the decision unit 9b and to manage maintenance may be stored in the program storage device 91. The program storage device 91 is storage medium, such as a magnetic disk.

The decision unit 9b is a computer including a central processing unit (CPU) 90a and a program storage device 94. The program storage device 94 stores computer programs including sets of instructions to be executed to processing images formed by the camera 17 and to decide whether or not the coating liquid R was spouted on the basis of the images formed by the camera 17, such as an image processing program and a decision program. The program storage device 94 is a storage medium, such as a magnetic disk.

An image processing procedure controlled by the image processing will be described. The camera 17 is capable of forming an image of all the nozzles 10 arranged in a row and an area between a plane containing the tips 10a of the nozzles 10 and the surface W1 of the wafer W. The camera 17 gives an image of this area to the decision unit 9b. The decision unit 9b executes the image processing program for processing the image to cut out a necessary part of the image. For example, FIGS. 7A, 7B, 7C and 7D show pictures obtained by the decision unit 9b by executing an image processing program.

The decision unit 9b includes a storage device 95 for storing an image formed by the camera 17 when the coating liquid R is spouted normally from the nozzle. The decision unit 9b uses this image to decide whether or not the coating liquid was spouted from the nozzle and whether or not changes occurred in the condition of the spouted coating liquid. The storage device 95 is a storage medium, such as a magnetic disk.

The display console 8 is connected to the controller 9. The display console 8 displays results of decision made by the decision unit 9b of the controller 9 by a monitor according to instructions provided by the control unit 9b of the controller 9 to inform the operator of the results of decision.

Actions of the laser beam L emitted by the laser light source 110 will be described. Referring to FIGS. 3A and 3B, the laser light source 110 emits the laser beam L from a position between the nozzle 10 and the camera 17 toward an irradiation point T1 on the surface W1 of the wafer W slightly on the side of the laser light source 110 with respect to a falling point T on the surface W1 of the wafer W at which the coating liquid R spouted from the nozzle 10 falls. The laser beam L is reflected by the surface W1 of the wafer W toward an area between the tip 10d of the nozzle 10 and the surface W1 of the wafer W. A laser beam projecting angle is adjusted by an angle adjusting device such that the laser beam L travels along optical paths shown in FIG. 3A.

The laser beam L projected toward the area between the tip 10d of the nozzle 10 and the surface W1 of the wafer W travels through the area without being irregularly reflected when the coating liquid R is not projected from the tip 10d of the nozzle 10 because there is nothing that reflects the laser beam L in the area.

Figure 7:
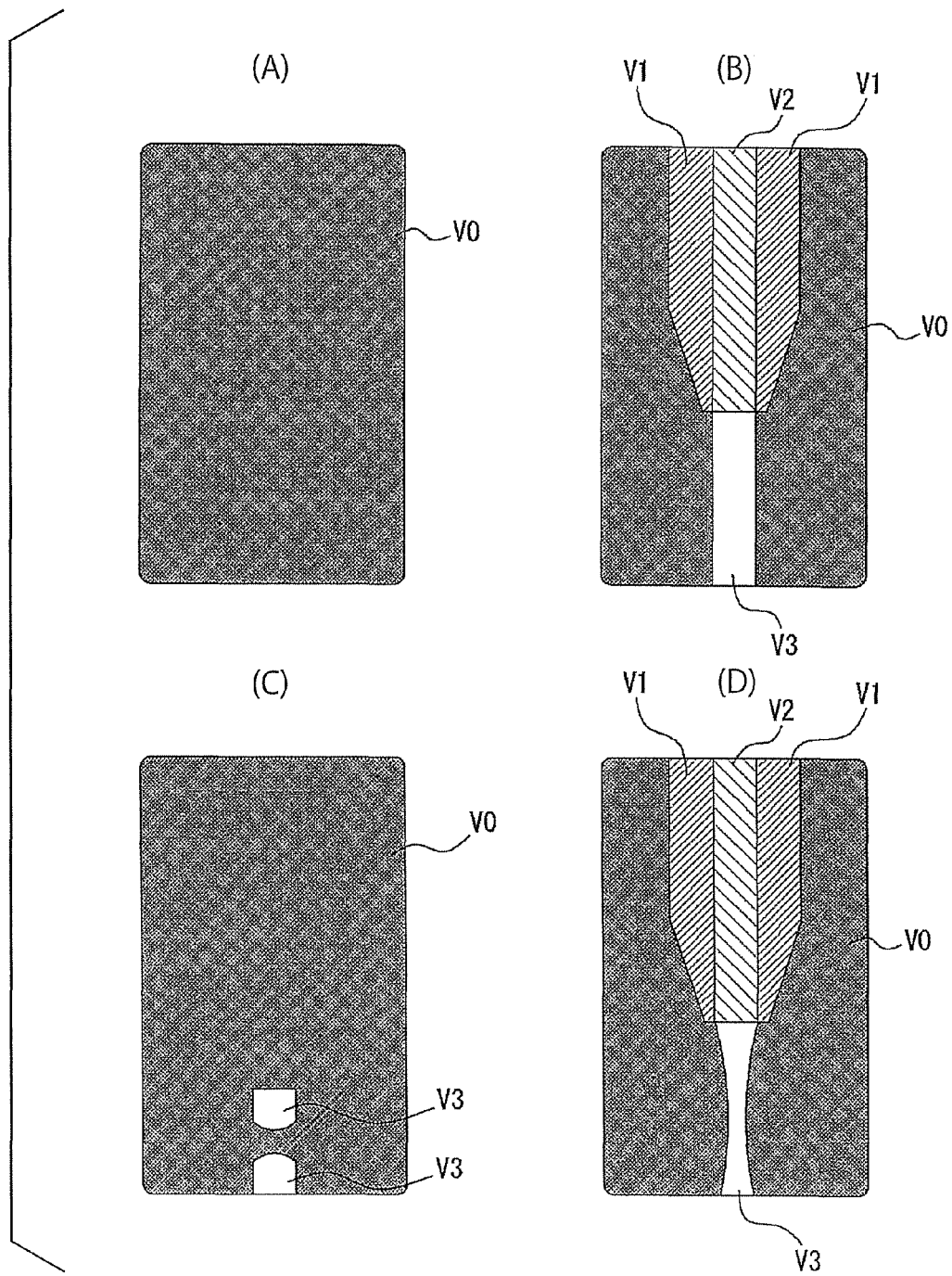
FIGS. 7A, 7B, 7C and 7D are pictures of an area including a processing liquid spouting nozzle when a processing liquid spouting operation is stopped normally, when the processing liquid was spouted normally, when the processing liquid dripped or bubbled, and when a column of the processing liquid narrowed, respectively, formed by a camera.

An image of this condition of the area formed by the camera 17 is equivalent to a picture shown in FIG. 7A. Any reflected laser beam L can be recognized in the picture and the whole picture is dark and has a low lightness value V0 and is dark.

FIGS. 3B and 3C show a state when the coating liquid R is spouted from the nozzle 10, in which paths of the laser beam L are indicated by the arrows. The coating liquid R spouted from the nozzle 10 forms a coating liquid column R1 instantaneously between the tip 10d of the nozzle 10 and the surface W1 of the wafer W. The laser beam L projected toward the area between the tip 10d of the nozzle 10 and the surface W1 of the wafer W falls on the coating liquid column R1 and is reflected irregularly in the coating liquid column R1. Consequently, the coating liquid column R1 shines. The irregularly reflected laser beam L travels into the coating liquid R in the passage 10e formed in the tubular part 10c. Since the tubular part 10c is made of a transparent material, the shining coating liquid R in the passage 10e can be recognized.

FIG. 7B shows a picture equivalent to an image of the shining coating liquid column R1 and the shining coating liquid R in the passage 10e of the nozzle 10 formed by the camera 17. As shown in FIG. 7B, since reflected laser beam L reflected by the coating liquid column R1 falls directly on the camera 17, the coating liquid column R1 shines in the highest brightness and the picture of the coating liquid column R1 has the highest lightness value V3. Since the reflected laser beam L reflected by the coating liquid R in the passage 10e of the nozzle 10 is transmitted by the transparent tubular part 10c and falls on the camera 17, the coating liquid R in the passage 10e of the nozzle 10 shines in a somewhat lower brightness and hence the picture of the coating liquid R in the passage 10e has a lightness value V2 lower than the lightness value V3 of the coating liquid column R1. Since some of the reflected light rays transmitted by the tubular part 10c are reflected before falling on the camera 17, the tubular part 10c shines in a still lower brightness and hence the picture of the tubular part 10c has a still lower lightness value V1. The lightness of a picture of a space surrounding the nozzle 10 and the coating liquid column R1 is V0 because there is nothing that reflects light in that space.

A decision procedure to be executed by the decision unit 9b will be described. The decision unit 9b stores reference data in the storage device 95. The reference data is an image of a condition in which the coating liquid R is spouted normally from the nozzle 10, formed by the camera 17 in response to an instruction given to the controller 9 by the operator. The camera 17 picks up images at time intervals of, for example, 200 ms while the coating liquid R is being spouted by a normal spouting action. The analog images formed by the camera 17 are converted into 8-bit digital signals of a predetermined resolution capable of producing images in 256 gradation levels. As mentioned above, FIG. 7A an image of reference data on a normal spout stopping condition and FIG. 7B is an image of reference data on a normal spouting condition. The storage device 95 stores the two images shown in FIGS. 7A and 7B as pieces of reference data. The reference data stored in the storage device 95 can be displayed by the monitor of the display console 8 to enable the operator to recognize and select the reference data.

The decision unit 9b provided with the storage device 95 storing the reference data can decide whether or not the coating liquid R was spouted and whether or not changes occurred in the condition of the coating liquid R spouted from the nozzle 10 through the comparison of an image formed by the camera 17 and the reference data in terms of the brightness of light irregularly reflected in the coating liquid R.

Figure 6:
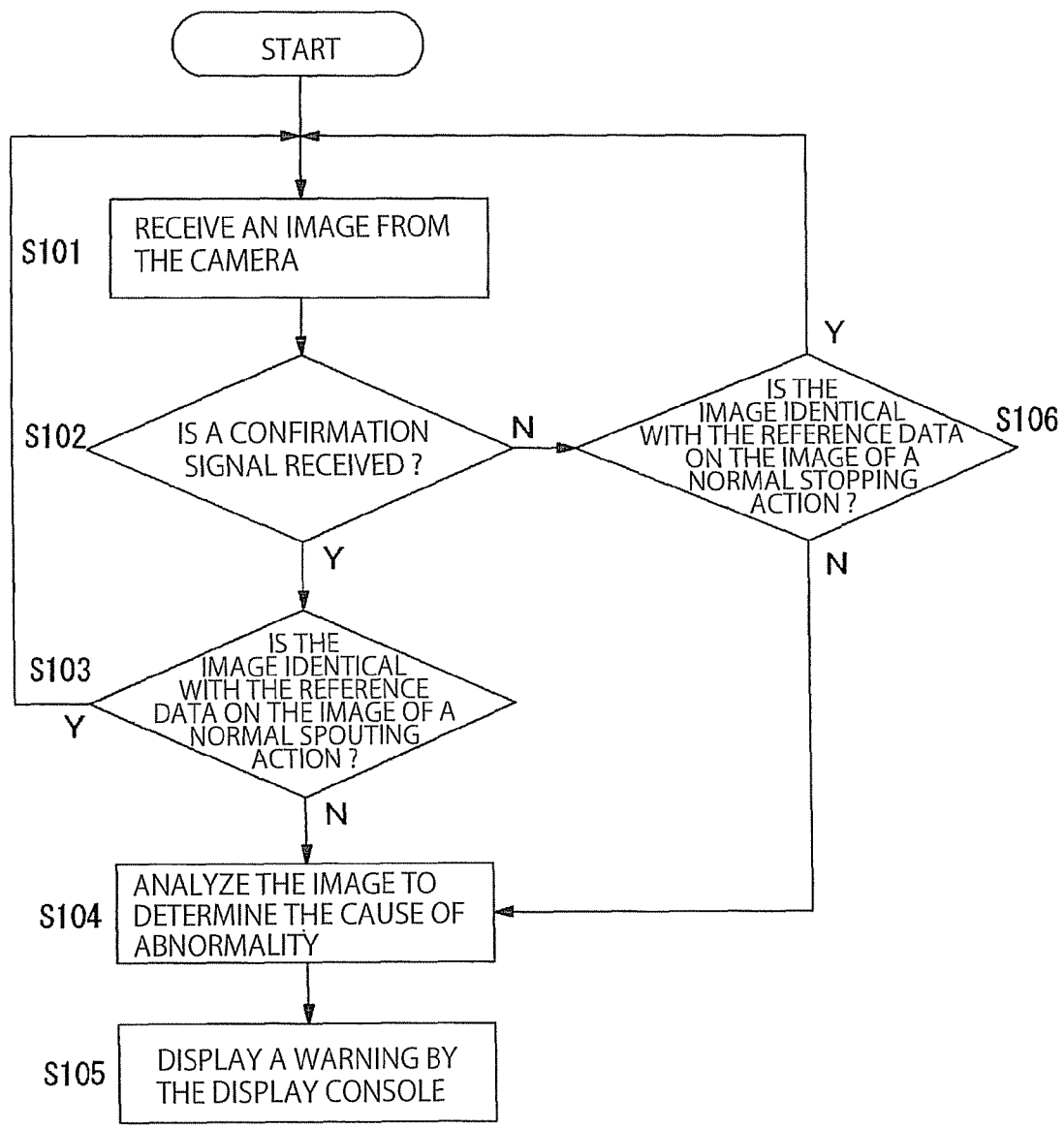
FIG. 6 is a flow chart of a decision procedure to be executed by a decision unit.

FIG. 6 is a flow chart of a decision procedure to be executed by the decision unit 9b. Upon the start of the coating unit 1, the decision unit 9b receives an image formed by the camera 17 in step S101. A query is made in step S102 to see if a confirmation signal is provided by the control unit 9a. If the response to the query in step S102 is affirmative, a query is made in step S103 to see if the image is identical with the reference data on the image of a normal spouting action shown in FIG. 7B. If the response to the query made in step S102 is negative, a query is made in step S106 to see if the image is identical with the reference data on the image of a normal stopping action shown in FIG. 7A. If the response made in either of steps S103 and S106 is affirmative, steps S101 and S102 are repeated. If the response made in either of steps S103 and S106 is negative, the decision unit 9b analyzes the image to determine the cause of abnormality in step S104 and makes the display console 8 display a warning signifying the cause of abnormality in step S105.

More concretely, upon the start of the coating unit 1, the control unit 9a executes the process control program to operate the camera 17, the driving mechanism 15 of the nozzle carrying mechanism 20, the coating liquid supply mechanisms 70, the pneumatic valves 72, the suck-back valves 73 and the laser light source 110. The control unit 9a gives a coating liquid supply signal to the pneumatic valve 72 to make the pneumatic valve 72 open to spout the coating liquid R from the nozzle 10 and at the same time, gives a confirmation signal to the decision unit 9b.

The coating liquid supply signal opens the pneumatic valve 72, and then the coating liquid R is spouted from the nozzle 10. The camera 17 forms an image of those actions and gives the image to the decision unit 9b in step S101. The decision unit 9b makes a query in step S102 to see if the confirmation signal is received. If the response in step S102 is affirmative, the decision unit 9b compares the reference data, namely, the picture shown in FIG. 7B, and the image in terms of lightness, and analyzes the result of comparison. If the decision unit 9b decides that the image is identical with the reference data the response to the query made in step S103 is affirmative and it is known that the coating liquid R was spouted from the nozzle 10. In this case, the decision unit 9b does not give any signal to the display console 8 and the procedure returns to step S101. When any signal is not given to the display console 8, the display console 8 displays a warning, "NORMAL". The decision program is executed for image comparison and image analysis.

A signal representing the image formed by the camera 17 is sent to the decision unit 9b in step S101. When the response to the query made in step S102 is negative, the decision unit 9b compares the image and the reference data, namely, the picture shown in FIG. 7A, in terms of lightness. If it is decided that the image is identical with the reference data shown in FIG. 7A, the response to the query made in step S106 is affirmative and it is decided that the coating liquid R was not spouted from the nozzle 10. In this case, the decision unit 9b does not give any signal to the display console 8 and the procedure returns to step S101 and the display console 8 remains displaying "NORMAL".

An image formed by the camera 17 is sent to the decision unit 9b in step S101. When the decision unit 9b receives a confirmation signal from the control unit 9a, i.e., the response to the query made in step S102 is affirmative, it is decided that the image is not identical with the reference data, i.e., the response to the query made in step S103 is negative, and image analysis proved that the image is identical with the picture shown in FIG. 7A, the decision unit 9b decides in step S104 that the coating liquid R was not spouted from the nozzle 10. In this case, the decision unit 9b gives a warning signal to the display console 8, and then the display console 8 displays a warning, "ABNORMAL, NO SPOUTING" in step S105.

As mentioned above, the coating unit 1 can decide whether or not the coating liquid R was spouted from the nozzle 10 and can decide whether or not changes occurred in the condition of the coating liquid R spouted from the nozzle 10.

An image formed by the camera 17 is sent to the decision unit 9b in step S101. When the decision unit 9b does not receive a confirmation signal from the control unit 9a, i.e., the response to the query made in step S102 is negative, it is decided that the image is not identical with the reference data, i.e., the response to the query made in step S103 is negative, and image analysis proved that the image is not identical with the picture shown in FIG. 7B, the decision unit 9b decides in step S104 that timing of spouting the coating liquid R from the nozzle 10 is improper. In this case, the decision unit 9b gives a warning signal to the display console 8 to make the display console 8 display a warning, "ABNORMAL, WRONG SPOUT TIMING" in step S105. When the decision unit 9b receives a confirmation signal from the control unit 9a and there is a time lag between the reception of the confirmation signal and the reception of the image, it can be decided that timing of spouting the coating liquid R from the nozzle 10 is improper.

If trickling of the coating liquid R from the tip 10d of the nozzle 10, namely, dripping, or inclusion of gas in the coating liquid R at the start of spouting from the nozzle 10, namely, bubbling, occurs, a picture shown in FIG. 7C is equivalent to the image. Since dripping or bubbling breaks the coating liquid column R1, the reflected light cannot travel into the nozzle 10 and hence the nozzle does not shine. A resist film of an irregular thickness is formed when the coating liquid R drips down on the wafer W or the bubbled coating liquid R is spouted onto the wafer W and hence faulty exposure results.

When the camera 17A forms an image equivalent to a picture shown in FIG. 7C, the decision unit 9b receives a confirmation signal from the control unit 9a in step S102, and decides that the image is not identical with the reference data, namely, the picture shown in FIG. 7A or 7B, i.e. both the responses to the queries made in steps S103 and S106 are negative. The decision unit 9b proceeds with image analysis. The decision unit 9b decides in step S104 that dripping or bubbling occurred on the basis of results of comparison of the image with a picture of the dripping coating liquid R or the bubbled coating liquid R stored in the storage device 95 and calculated ratios of areas in the picture respectively having lightness values V0 to V3 to the total area of the picture. In this case, the decision unit 9b gives a warning signal to the display console 8 in step S105 to make the display console 8 display a warning, "ABNORMAL, DRIPPING OR BUBBLING".

When column narrowing, namely, narrowing of the coating liquid column R1 of the coating liquid R, occurs, a picture shown in FIG. 7D is obtained. Column narrowing occurs when the suck back valve 73 sucks back the coating liquid R imperfectly into the nozzle 10 and the coating liquid R drips from the tip 10d of the nozzle 10 or the coating liquid R is spouted improperly from the nozzle 10. Column narrowing is a sign of dripping.

If the camera 17 forms an image equivalent to the picture shown in FIG. 7D in step S101, the decision unit 9b received a confirmation signal from the control unit 9a in step S102 decides that the image is not identical with the reference data, namely, the picture shown in FIG. 7A or 7B, i.e., responses to the queries made in steps S103 and S106 are negative. The decision unit 9b proceeds with image analysis and decides in step S104 that the narrowing of the coating liquid column R occurred on the basis of results of comparison of the image with a picture of a narrowed coating liquid column stored beforehand in the storage device 95 and the comparison of the width of the image of the coating liquid column R1 and the width of the coating liquid column of the reference data, namely, the picture shown in FIG. 7B. In this case, the decision unit gives a warning signal to the display console 8 to make the display console 8 display a warning, "ABNORMAL, COATING LIQUID COLUMN NARROWED".

The lightness of the picture of the coating liquid R in the passage 10e of the nozzle 10 is V2. The decision unit 9b can decide that the coating liquid R contains bubbles when black spots of the lightness value V0 or V1 are found in part of the picture having the lightness value V2 of the coating liquid R through the analysis of the image formed by the camera 17. In this case, the decision unit 9b makes the display console 8 display a warning, "ABNORMAL, BUBBLING".

The decision unit 9b can determine the reflectivity of the coating liquid R spouted from the nozzle 10 on the basis of the luminous intensity of the laser light L and the luminous intensity of an image formed by the camera 17. The respective reflectivity values of the different kinds of coating liquids R are stored beforehand in the storage device 95. The decision unit 9b can identify the coating liquid R being spouted at the present from the nozzle 10 through the comparison of the measured reflectivity with the relevant reflectivity stored in the storage device 95. the decision unit 9b can make the display console 8 display parameters, such as kind and amount, of the spouted coating liquid R on the basis of data obtained through the comparison of the reflectivity values.

As mentioned above, the camera 17 picks up images at time intervals of 200 ms. The decision unit 9b can determine light-emitting time for which the coating liquid R emits light through the analysis of the images formed in time series. The light-emitting time for which the coating liquid R emits light can be considered to be equal to spouting time for which the nozzle 10 spouts the coating liquid R. The decision unit 9b measures the light-emitting time for which the coating liquid R emitted light from the image formed by the camera. The decision unit 9b can decide whether or not the measured light-emitting time is normal through the comparison of the measured light-emitting time with light-emitting time stored in the storage device 95. If the measured light-emitting time is abnormal, the decision unit 9b gives a warning signal to the display console 8 to make the display console 8 display a warning, "ABNORMAL DISCHARGE.

When the decision unit 9b decides that the coating liquid R was not spouted or the coating liquid R was spouted abnormally, the decision unit 9b gives a faulty spout warning signal to the control unit 9a. Then, the control unit 9a executes a correction program or a maintenance management program to operate the camera 17, the driving mechanism 15 of the nozzle carrying mechanism 20, the pneumatic valve 72, the suck-back valve 73 and the laser light source 110 and to carry out correcting operations.

The coating unit 1 makes the laser light source 110 illuminate the area between the tip 10d of the nozzle 10 and the surface W1 of the wafer W with the laser beam L. The laser beam L travels into the coating liquid R spouted from the nozzle 10 toward the wafer W and is reflected by the coating liquid R. Consequently, the coating liquid R shines and the camera 17 can form an image expressing the brightness of the shining coating liquid R. The decision unit 9b can decide whether or not the coating liquid R was spouted from the nozzle 10 and whether or not changes in the condition of the coating liquid R spouted from the nozzle 10, such as bubbling resulting from inclusion of gas in the coating liquid, dripping of the coating liquid R from the nozzle 10 and narrowing of the coating liquid column R1, occurred and determine spouting time for which nozzle 10 spouted the coating liquid R through the analysis of the image formed by the camera 17. Thus, the coating unit 1 can accurately decide whether or not the coating liquid R was spouted from the nozzle 10 and whether or not changes occurred in the condition of the coating liquid spouted from the nozzle 10. Therefore, increase in loss resulting from abnormal spouting of the coating liquid R from the nozzle 10 can be suppressed and loss of the coating liquid R can be limited to the least extent.

Since the laser beam L illuminates only the area between the tip 10d of the nozzle 10 and the surface W1 of the wafer W, unnecessary direct illumination of the nozzle 10 and such and unnecessary reflection of light can be suppressed, which improves the accuracy of an image formed by the camera 17.

The laser light source 110 projects the laser beam L toward the irradiation point T1 on the surface W1 of the wafer W slightly on the side of the laser light source 110 with respect to a falling point T on the surface W1 of the wafer W at which the coating liquid R spouted from the nozzle 10 falls such that the laser beam L is reflected by the surface W1 of the wafer W toward the area between the tip 10d of the nozzle 10 and the surface W1 of the wafer W. Therefore, the camera 17 does not receive light reflected by the surface W1 of the wafer W and can form an image accurately expressing the brightness of the coating liquid R, which improves the accuracy of the image.

Since the tubular part 10c of the nozzle 10 is made of a transparent material, the tubular part 10c of the nozzle 10 can transmit light irregularly reflected by the coating liquid R in the passage 10e of the nozzle 10. Therefore, the camera 17 can form an image of the shining coating liquid R in the passage 10e of the nozzle 10. The decision unit 9b can decide the condition of the coating liquid R on the basis of both the image of the area between the tip 103 of the nozzle 10 and the surface W1 of the wafer W and that of the coating liquid R in the passage 103. Thus, the decision unit 9b can accurately decide whether or not the coating liquid R was spouted from the nozzle 10 and whether or not changes occurred in the condition of the spouted coating liquid R.

The decision unit 9b has the storage device 95 storing reference data, namely, the image formed by the cameral 17 when the coating liquid R was spouted by a normal spouting action. The decision unit 9b decides whether or not the coating liquid R was spouted from the nozzle 10 and whether or not changes occurred in the condition of the spouted coating liquid R on the basis of the results of comparison of a picture equivalent to an image formed during the spouting operation and a reference picture, namely, the reference data, in terms of lightness. Thus, the decision unit 9b can make an accurate decision.

The nozzle carrying mechanism 20 carries the nozzles 10 above the wafer W held by the spin chuck 41. The nozzle carrying mechanism 20 has the nozzle support arm 11 supporting the eleven nozzles 10 arranged in a row. The laser beam L emitted by the laser light source 110 held beside the row of the nozzles 10 falls on the surface W1 of the wafer W in a line in the area between a plane containing the tips 10d of the nozzles 10 and the surface W1 of the wafer W. Thus, the area between the plane containing the tips 10d of the nozzles 10 and the surface W1 of the wafer W can be accurately illuminated.

In the coating unit 1, the eleven nozzles 10 are arranged in a row on the nozzle head 11a of the nozzle arm 11 and the single laser light source 110 linearly illuminates the area between the plane containing the tips 10d of all the nozzles 10 and the surface W1 of the wafer W with the laser beam L. It is satisfactory to emit light into the area between a plane containing the tips 10d of the nozzles 10 and the surface W1 of the wafer W. For example, as shown in FIG. 5B, the eleven nozzles 10 may be arranged in a row on the nozzle head 11a of the nozzle arm 11 of the nozzle carrying mechanism 20, and eleven laser light sources 110a respectively for the nozzles 10 may be arranged in a row parallel to the row of the nozzles 10 to illuminate points on the surface W1 of the wafer W with spots of laser beams La.

The laser light sources 110a thus arranged can accurately illuminate areas each between the tip 10d of each of the nozzles 10 and the surface W1 of the wafer W with the laser beams La.

Figure 8:
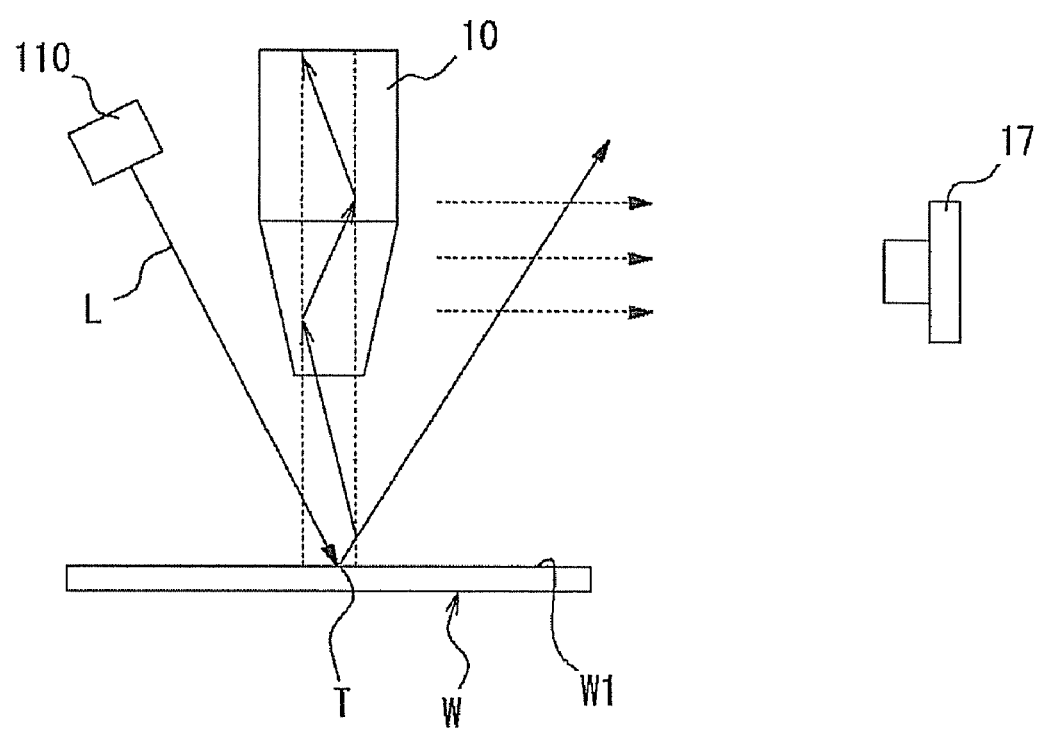
FIG. 8 is a schematic sectional view of a light source and a wafer in a state where a light source projects a light beam on a point on the wafer onto which the processing liquid is spouted.

In the coating unit 1 in the first embodiment, the laser light source 110 emits the laser beam L from a position between the nozzle 10 and the camera 17 toward the irradiation point T1 on the surface W1 of the wafer W slightly on the side of the laser light source 110 with respect to a falling point T on the surface W1 of the wafer W at which the coating liquid R spouted from the nozzle 10 falls. Then, the laser beam L is reflected by the surface W1 of the wafer W toward the area between the tip 10d of the nozzle 10 and the surface W1 of the wafer W. Since the laser beam L needs only to be projected into the area between the tip 10d of the nozzle 10 and the surface W1 of the wafer W, the laser light source 110 may emit the laser beam L toward the falling point T at which the coating liquid R spouted from the nozzle 10 falls on the wafer W as shown in FIG. 8. In this case, the camera 17 and the laser light source 110 are fixed by fixing means, not shown, for example, to the housing 30.

When the laser light source 110 and the camera 17 are thus arranged as shown in FIG. 8, the laser light source 110 emits the laser beam L toward the falling point T at which the coating liquid R spouted from the nozzle 10 falls on the wafer W. Therefore, light reflected by the surface W1 of the wafer W does not fall on the camera 17 and hence the camera 17 can form an image accurately indicating lightness.

Figure 9:
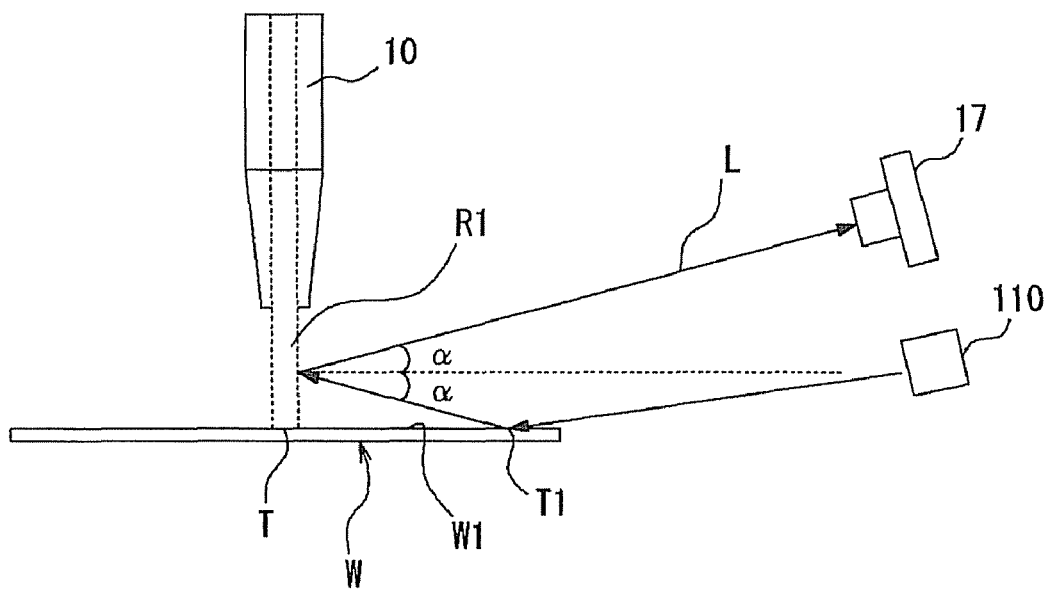
FIG. 9 is a schematic sectional view of a processing liquid spouting nozzle, a light source and a camera arranged such that the camera is disposed with its optical axis aligned with a line extending from the point of incidence of a light beam projected by the light source at an angle equal to the incident angle of the light beam to a normal at the point of incidence of the light beam.

In the coating unit 1 in the first embodiment, the camera 17 is held such that the camera 17 can form an image of the area between the plane containing the tips 10d of the nozzles 10 held on the nozzle head 11a and the surface W1 of the wafer W. The camera 17 may be held at a position shown in FIG. 9. In FIG. 9, the laser beam L falls on the coating liquid column R1 at an incident angle α and is reflected by the coating liquid column R1 at a reflection angle α. The camera 17 may be disposed on a line at an angle α equal to the reflection angle α to the line perpendicular to the coating liquid column R1 at the point of reflection as shown in FIG. 9. In this case, the camera 17 and the laser light source 110 are fixed by fixing means, not shown, for example, to the housing 30.

When the camera 17 is thus disposed, the camera 17 forms an image on an optical path of reflected light having the highest luminous intensity, which improves the accuracy of the image.

Second Embodiment

Figure 10:
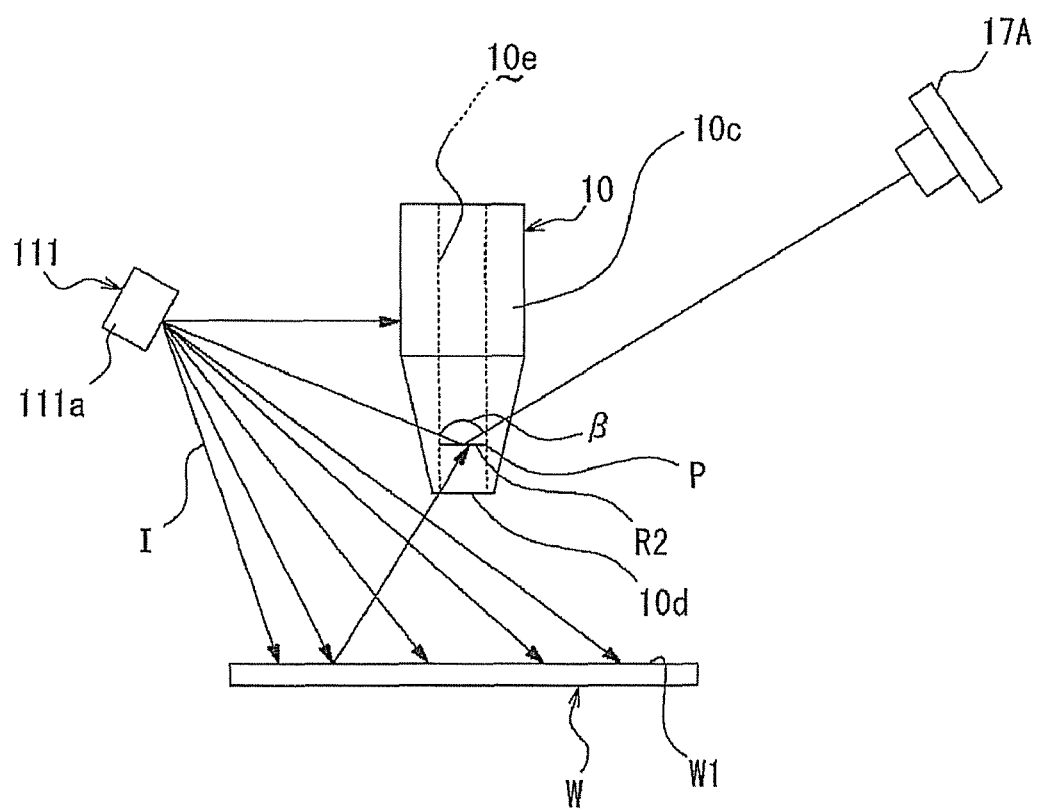
FIG. 10 is a schematic side elevation of a processing liquid spouting nozzle included in a coating unit in a second embodiment according to the present invention disposed above a wafer.

In the coating unit 1 in the first embodiment, the laser beam L is projected into the area between the plane containing the tips 10d of the nozzles 10 and the surface W1 of the wafer W. An infrared emitter 111 may emit infrared radiations I toward the area between a plane containing the tips 10d of the nozzles 10 and the surface W1 of the wafer W and toward the nozzles 10 as shown in FIG. 10, and the decision unit 9b may measure, in addition to measuring the brightness of the coating liquid R illuminated by the rays penetrated into and reflected by the coating liquid R to decide whether or not the coating liquid R was spouted from the nozzle 10 and whether or not changes occurred in the condition of the coating liquid R spouted from the nozzle 10, the brightness of the coating liquid R in the passage 10e of the nozzle 10 to decide whether or not the level of the coating liquid R in the passage 10e changed.

A coating unit in the second embodiment, includes the infrared emitter 111 that emits infrared radiations I toward the area between a plane containing the tips 10d of the nozzles 10 and the surface W1, a camera 17A, such as a CCD camera, that forms an image of nozzles 10 and an area between a plane containing the tips 10d of the nozzles 10 and the surface W1 of the wafer W, a control unit 9a, not shown, which provides a spout signal requesting the nozzle 10 to spout the coating liquid R toward the wafer W and a imaging signal requesting the camera 17A to start an imaging operation, and a decision unit 9b, not shown, which decides whether or not the coating liquid R was spouted from the nozzle 10 and whether or not changes occurred in the condition of the coating liquid R spouted and whether or not the surface R2 of the coating liquid R in the passage 10e of the nozzle 10 changed on the basis of analysis of the brightness of an image of the coating liquid R irradiated with the infrared radiations I emitted toward the coating liquid R, penetrated into the coating liquid R and reflected by the coating liquid R and the brightness of an image of the coating liquid R in the passage 10e of the nozzle 10.

The infrared emitter 111 is an infrared LED illuminator. The infrared emitter 111 can irradiate the nozzles 10, an area between a plane containing the tips 10d of the nozzles and the surface W1 of the wafer W and the surface W1 of the wafer W with infrared radiations I. There are many kinds of coating liquids R of different colors. When a red, blue or green resist solution is used for forming a resist film on the wafer W, and visible light having a wavelength in the range of 400 to 700 nm is used for irradiation, the visible light is absorbed and reflected and weak visible light is transmitted by the resist solution, which makes it difficult to recognize a coating liquid column R1 clearly. When the colorless, transparent thinner is used for coating, a space around the coating liquid column R1 is illuminated brightly and visible light is used for irradiation, it is difficult for the camera 17A to form a clear image of the coating liquid column R1. When the infrared radiations I having a comparatively long wavelength are used for irradiation, the coating liquid column R1 and the surface R2 of the coating liquid R can be stably highlighted regardless of the color of the coating liquid R. Therefore, images of all kinds of coating liquids R can be easily obtained when the infrared radiations I are used for irradiation. Thus, the coating liquid column R1 and the surface R2 of the coating liquid R can be easily observed, and hence the risk of making a wrong decision on the basis of results of image processing can be reduced. Thus, it is preferable to use the infrared radiations I for irradiating the nozzles 10, and an area between a plane containing the tips 10d of the nozzles and the surface W1 of the wafer W.

Figure 11:
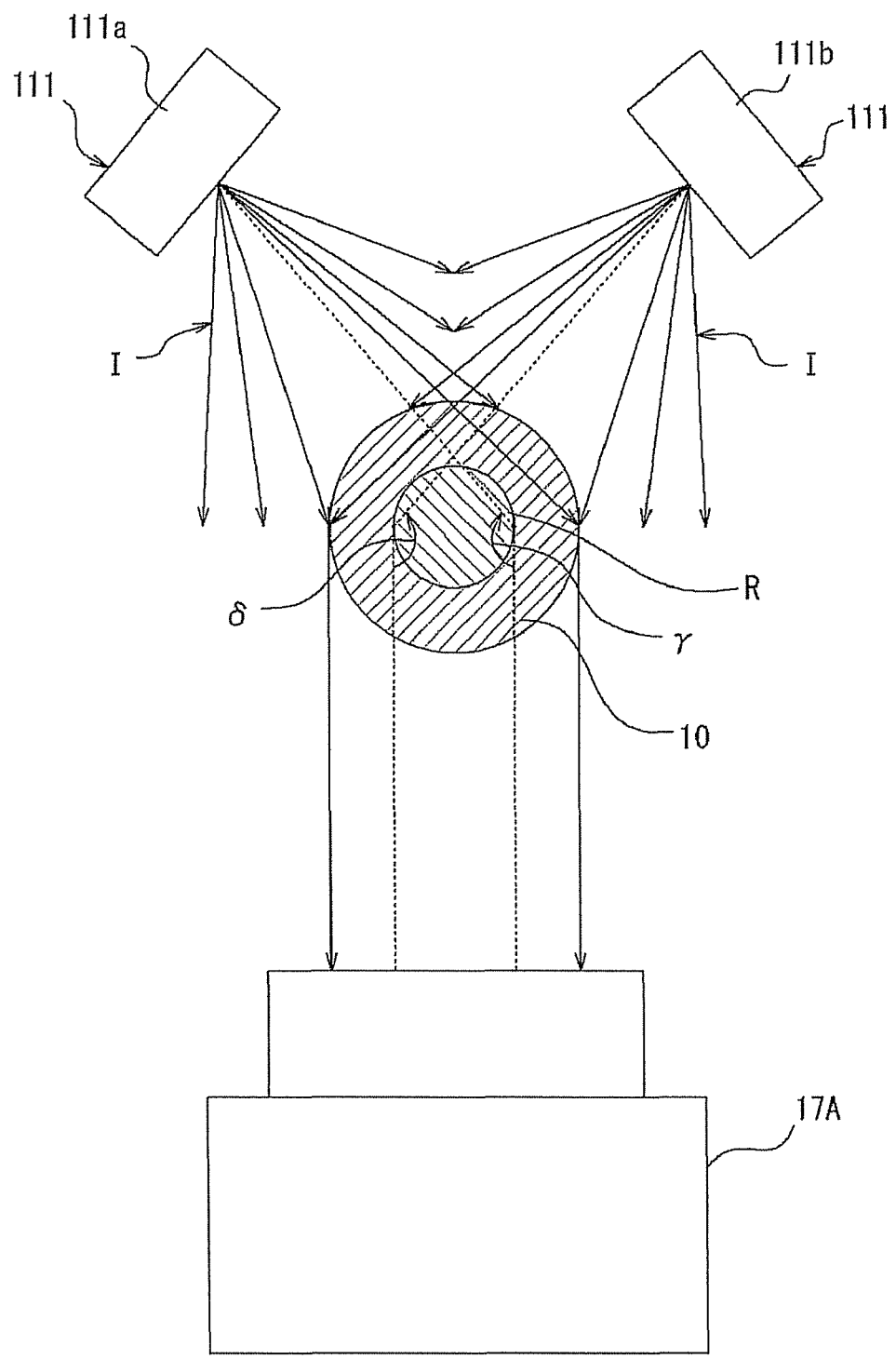
FIG. 11 is a schematic horizontal sectional view of the processing liquid spouting nozzle included in the coating unit in the second embodiment according to the present invention disposed above a wafer.

As shown in FIG. 11, the infrared emitter 111 includes a first infrared emitter 111a and a second infrared emitter 111b. The first infrared emitter 111a and the second infrared emitter 111b are disposed symmetrically with respect to the vertical axis of the nozzle 10. The angle γ in a horizontal plane between the optical axis of the first infrared emitter 111a and the optical axis of the camera 17A and the angle δ in a horizontal plane between the optical axis of the second infrared emitter 111b and the optical axis of the camera 17A are in the range of 120° to 160°. The first infrared emitter 111a and the second infrared emitter 111b emit infrared radiations I toward the nozzle 10 so that high-intensity reflected and refracted infrared radiations I travel from the side of the coating liquid column R1 of the coating liquid R spouted from the nozzle 10 toward the camera 17A to irradiate the side of the coating liquid column R in a clear contrast. Thus, the side of the coating liquid column R1 can be highlighted and an image of the coating liquid column R1 can be formed in improved accuracy.

The vertical axis of the nozzle 10 will be described. The angles γ and δ respectively specifying the respective positions of the first infrared emitter 111a and the second infrared emitter 111b are shown in FIG. 11. The angle γ is an angle in a horizontal plane between a vertical plane parallel to the optical axis of the camera 17A and tangent to the side on the side of the second infrared emitter 111b of the coating liquid R in the passage 10e of the nozzle 10 and a vertical plane containing the optical axis of the first infrared emitter 111a. The angle δ is an angle in a horizontal plane between a vertical plane parallel to the optical axis of the camera 17A and tangent to the side on the side of the first infrared emitter 111a of the coating liquid R in the passage 10e of the nozzle 10 and a vertical plane containing the optical axis of the second infrared emitter 111b.

Figure 15:
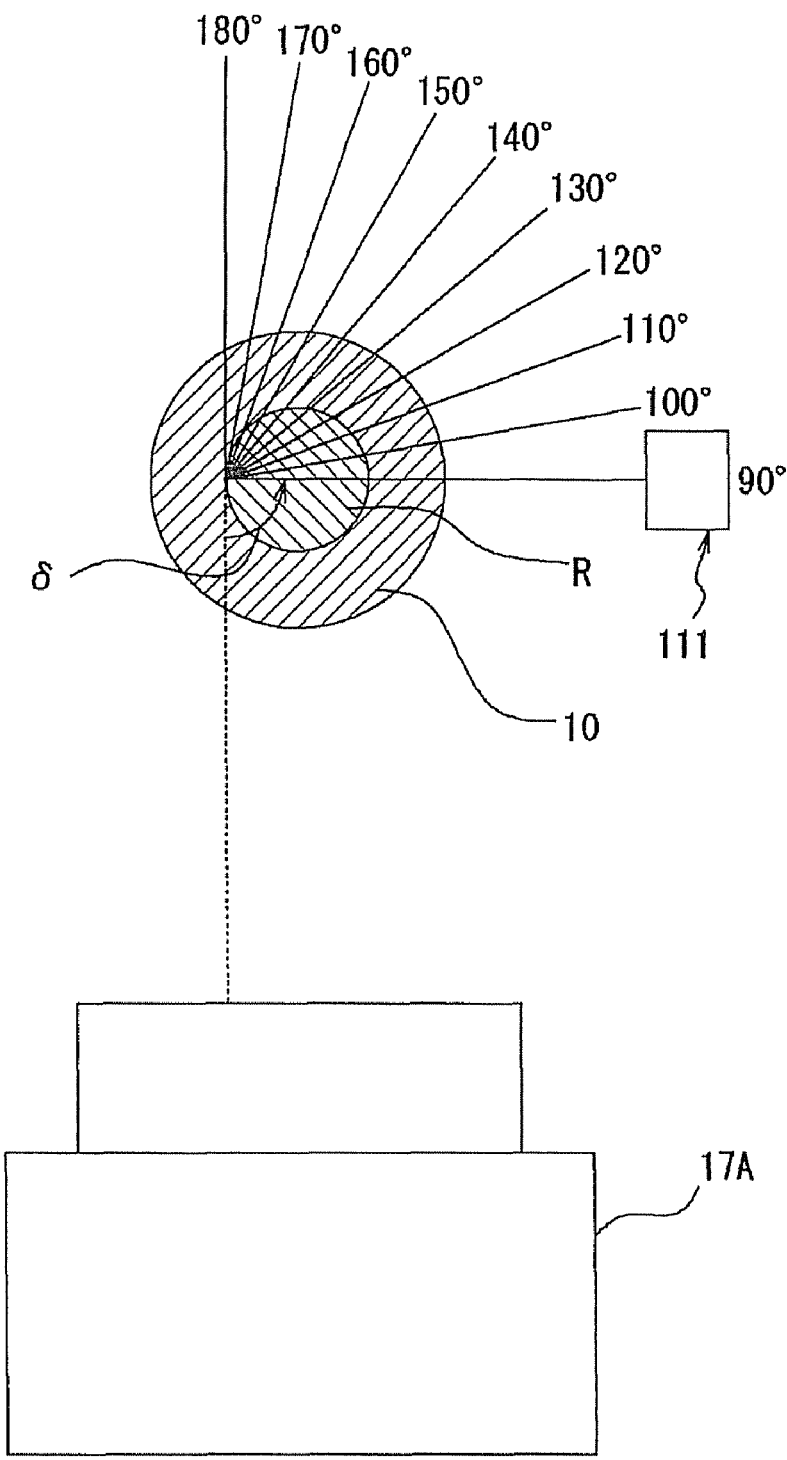
FIG. 15 is a schematic horizontal sectional view of the processing liquid spouting nozzle disposed with its axis extended vertically for assistance in explaining experiments in which the angle in a horizontal plane between the optical axis of a light source and the optical axis of an imaging device at an image pick-up position is changed in angular steps of 10° from 90° to 180°

Experiment was conducted. The experiments moved the infrared emitter 111b to change the angle δ in angular steps of 10° from 90° to 180° as shown in FIG. 15. The camera 17A formed an image when the infrared emitter 111b is positioned at each angular position. The angle δ is an angle in a horizontal plane between a vertical plane parallel to the optical axis of the camera 17A and tangent to the side on the side of the first infrared emitter 111a of the coating liquid R in the passage of the nozzle 10 and a vertical plane containing the optical axis of the second infrared emitter 111b. Angle β in a vertical plane between a light path of infrared radiations from the infrared emitter 111b to the surface R2 of the coating liquid R in the passage 10e of the nozzle 10 and a light path of reflected infrared radiations reflected from the surface R2 of the coating liquid R in the passage 10e of the nozzle 10 from the surface R2 to the camera 17A was fixed at 120°.

Figure 16:
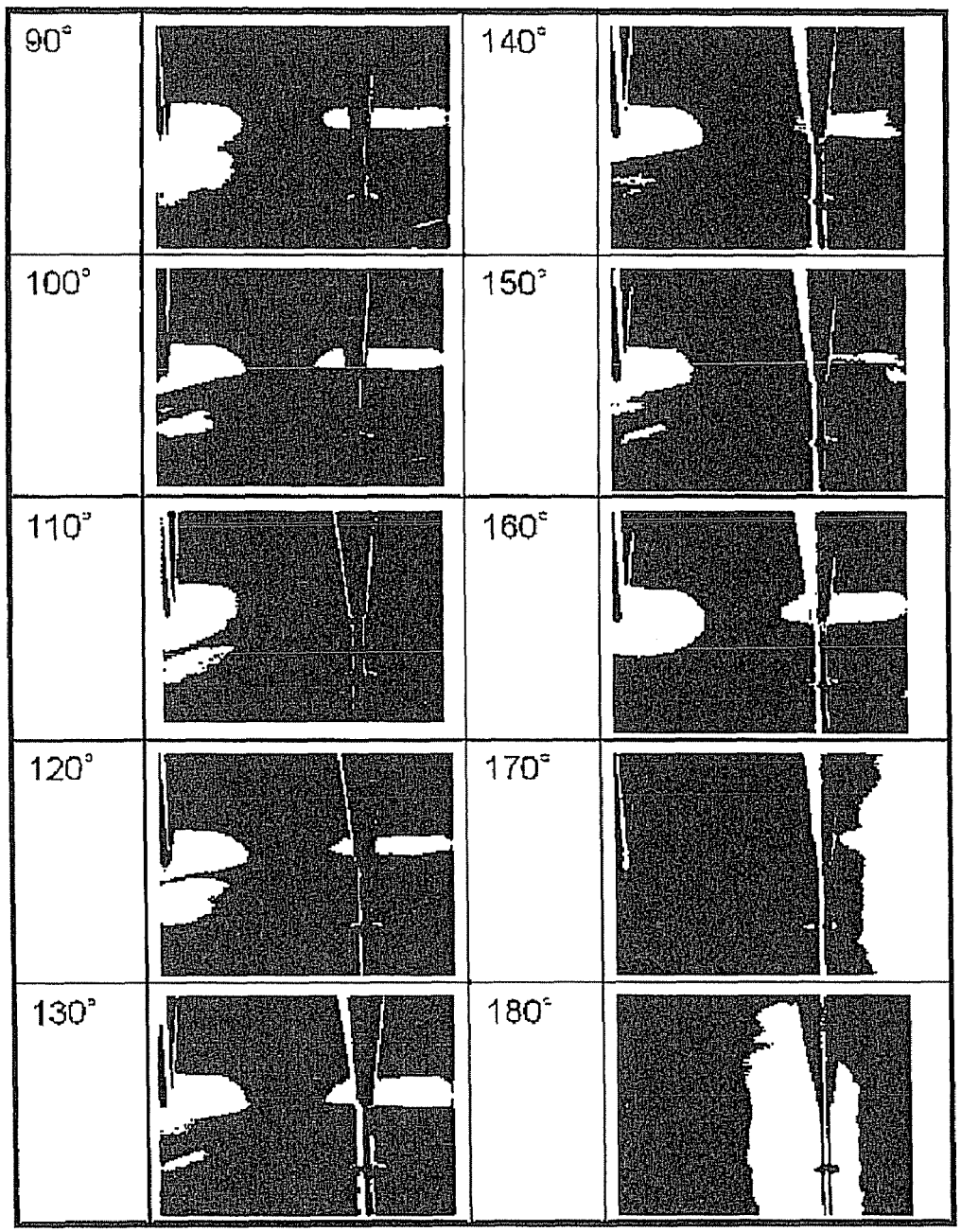
FIG. 16 shows pictures taken by the imaging device at different image pick-up positions during the experiments shown in FIG. 15.

Pictures shown in FIG. 16 were obtained by the experiments. The pictures proves that the side of the coating liquid column R1 can be stably highlighted and a clear image of the left side of the coating liquid column R1 can be formed when the angle δ is in the range of 120° to 160°.

It was found that, an image of the side of the coating liquid column R is obscure and the side of the coating liquid column R1 cannot be highlighted when the infrared irradiator 111b is positioned with the angle δ in a horizontal plane smaller than 120°. It was found that the intensities of reflected rays and refracted rays traveling toward the camera 17A are low and the side of the coating liquid column R1 cannot be highlighted when the infrared irradiator 111b is positioned with the angle δ in a horizontal plane greater than 160°. Although reflected rays and refracted rays from a central part of the coating liquid column R1 can be detected, respective intensities of reflected rays and refracted rays traveling from the side of the coating liquid R1 are low and the side of the coating liquid column R1 cannot be highlighted when the angle δ in a horizontal plane is 170° or 180°.

In the experiments, only the second infrared emitter 111b was disposed on the right side of the nozzle 10 to irradiate the left side of the coating liquid column R1 with the infrared radiations I. When both the first infrared emitter 111a and the second infrared emitter 111b are disposed symmetrically with respect to the nozzle 10 on the left and the right side, respectively, as viewed in FIG. 11 to irradiate the left and the right side of the coating liquid column R1 with the infrared radiations I, both the right and the left side of the coating liquid column R1 can be highlighted.

As shown in FIG. 10, the first infrared emitter 111a is disposed at a level higher than a predetermined level P of the coating liquid R in the passage 10e of the nozzle 10 such that the angle β in a vertical plane between the light path of infrared radiations from the infrared emitter 111a to the surface R2 of the coating liquid R at the predetermined level P and the light path of the reflected infrared radiations reflected from the surface R2 of the coating liquid R in the passage 10e of the nozzle 10 from the surface R2 to the camera 17A is in the range of 120° to 160°. The predetermined level P is a height at which the surface R2 of the sucked back coating liquid R rests in the passage 10e of the nozzle 10 when the coating liquid R is not spouted. The second infrared irradiator 111b is disposed similarly to the first infrared emitter 111a.

When the infrared emitters 111a and 111b are thus arranged, the surface R2 of the coating liquid R in the passage 10e of the nozzle is irradiated with both the infrared radiations fallen directly on the surface R2 and the reflected infrared radiations reflected from the wafer W to enhance the intensity of the reflected infrared radiations and the refracted infrared radiations traveling from the surface R2 of the coating liquid R in the passage 10e of the nozzle 10 toward the camera 17A. Thus, the surface R2 of the coating liquid R in the passage 10a of the nozzle 10 can be irradiated with the infrared radiations of a sufficiently high intensity and image of the surface R2 can be formed in improved accuracy.

Figure 17:
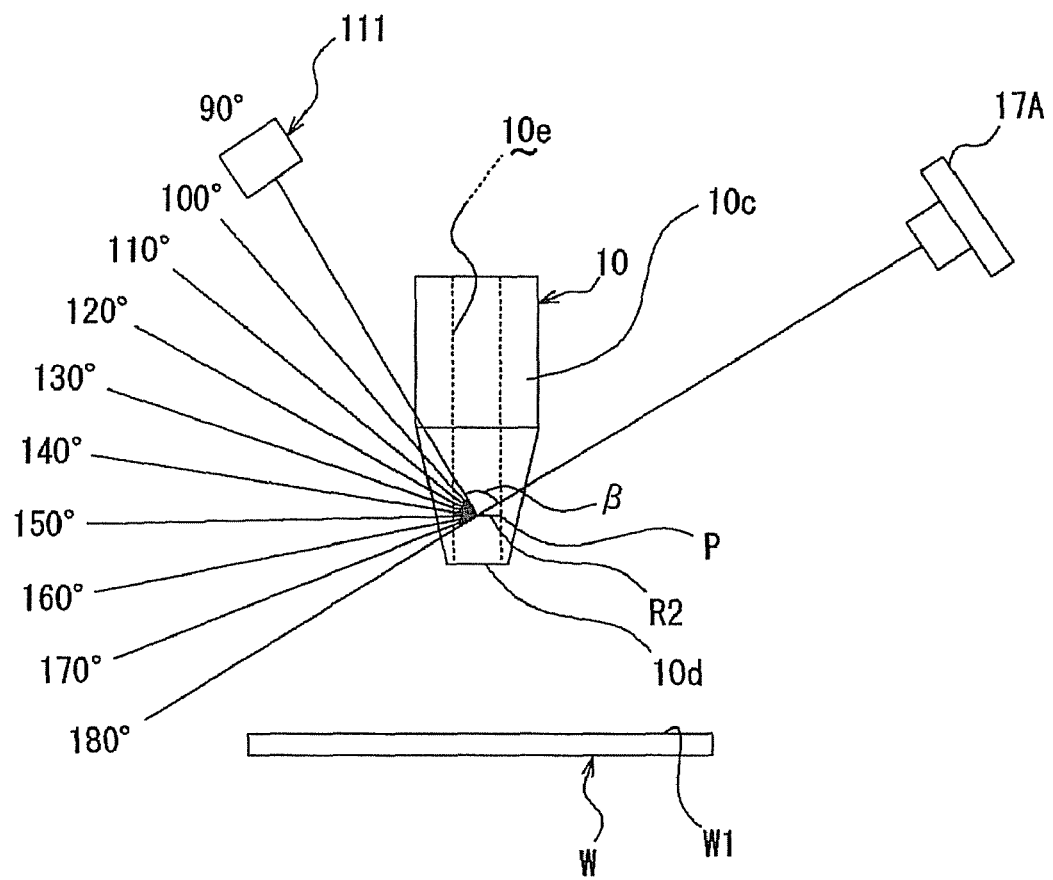
FIG. 17 is a schematic side elevation of the processing liquid spouting nozzle for assistance in explaining experiments in which the angle in a vertical plane between the light path of light from the light source to a point on the surface of the processing liquid at the predetermined level and the light path of reflected light from the same point on the surface of the processing liquid to the imaging device is changed in angular steps of 10° from 90° to 180° and the imaging device formed an image of an area including the processing liquid spouting nozzle at the angular positions relative to the light source.

As shown in FIG. 17, the angle β in a vertical plane between the light path of infrared radiations from the infrared emitter 111 to the surface R2 of the coating liquid R in the passage 10e of the nozzle 10 and the light path of reflected infrared radiations reflected from the surface R2 of the coating liquid R in the passage 10e of the nozzle 10 from the surface R2 to the camera 17A was changed in angular steps of 10° from 90° to 180° and the camera 17A formed images at every angle β. The angle δ in a horizontal plane was fixed at 120°.

Figure 18:
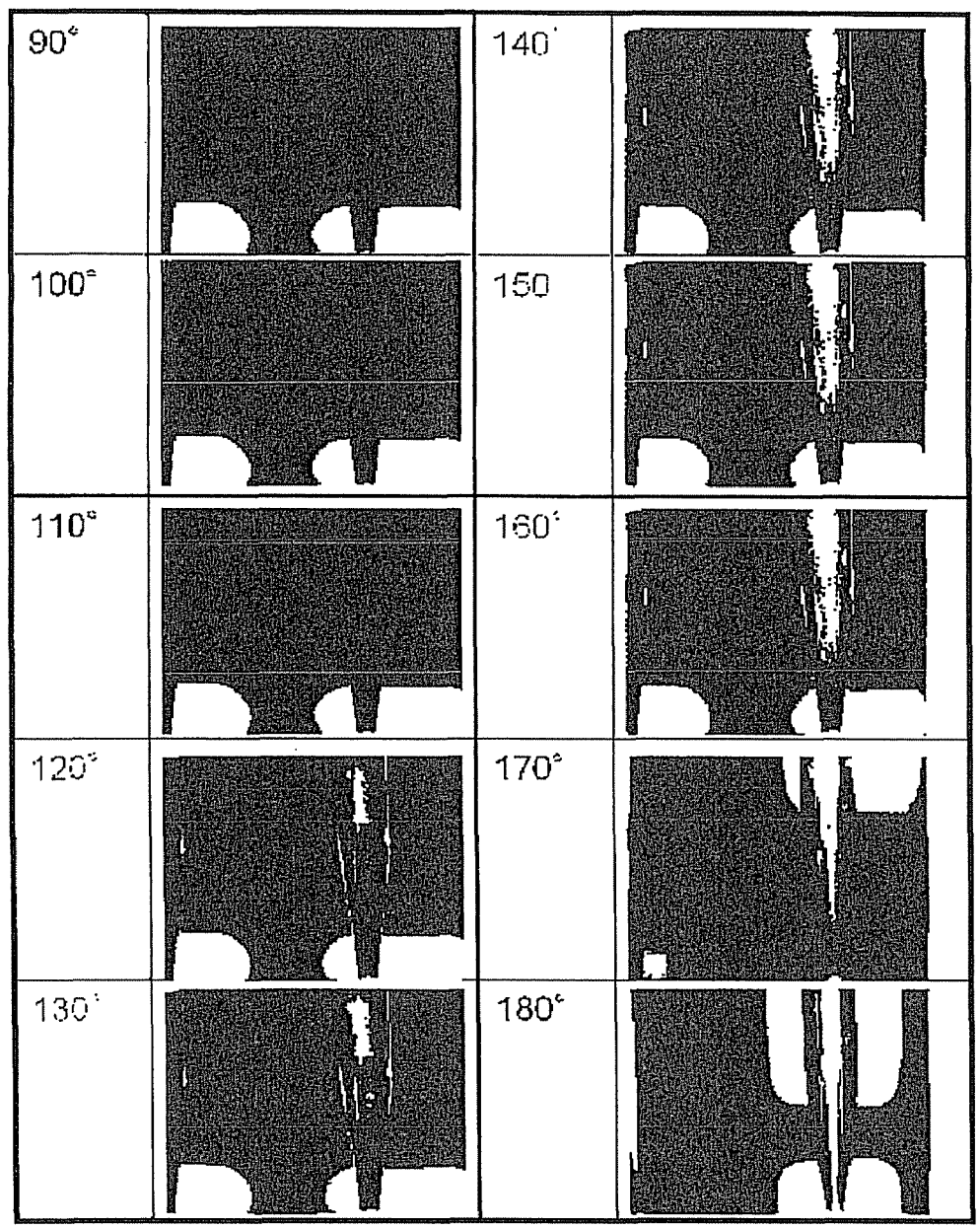
FIG. 18 shows pictures taken by the imaging device at different image pick-up positions during the experiments shown in FIG. 17.

Pictures shown in FIG. 18 were obtained by the experiments. Experiments proved that a clear image of the surface R2 of the coating liquid R in the passage 103 of the nozzle 10 can be formed when the angle β is in the range of 120° to 160° and the surface R can be stably highlighted.

It was found that that the respective intensities of the reflected infrared radiations and the refracted infrared radiations that fall on the camera 17A are low and the surface R2 of the coating liquid R cannot be highlighted when the angle β in a vertical plane is smaller than 120°. It was found also that the surface R2 of the coating liquid R is obscure and only the surface R2 of the coating liquid R cannot be highlighted when the angle β in a vertical plane is greater than 160°. For example, when the angle β in a vertical plane is 170° or 180°, the boundary between the surface R2 of the coating liquid R and the passage 10e was obscure owing to the infrared radiations reflected from the passage 10e of the nozzle 10.

The camera 17A may be an image sensor capable of forming an image of an object irradiated with the infrared radiations I. The camera 17A is not limited to a CCD camera and may be a CMOS camera.

A decision unit 9b included in a controller 9, similarly to the decision unit 9b of the first embodiment, can decide whether or not the coating liquid R was spouted and whether or not changes occurred in the condition of the coating liquid R spouted from the nozzle 10 on the basis of results of analysis of the image.

The second embodiment is the same as the first embodiment in other respects and hence parts of the second embodiment like or corresponding to those of the first embodiment are denoted by the same reference characters and the description thereof will be omitted.

Actions of the infrared radiations I emitted by the first infrared emitter 111a and the second infrared emitter 111b will be described. Referring to FIGS. 10 and 11, the first infrared emitter 111a and the second infrared emitter 111b irradiate the nozzle 10, an area between the tip 10d of the nozzle 10 and the surface W1 of the wafer W, and the surface W1 of the wafer W with the infrared radiations I. The nozzle 10, the area between the tip 10d of the nozzle 10 and the surface W1 of the wafer W, and the surface W1 of the wafer W are irradiated with the infrared radiations I emitted by the infrared emitter 111 even in a state where the coating liquid R is not spouted from the nozzle 10.

FIG. 12A shows a picture equivalent to an image formed by the camera 17A while the coating liquid R is not spouted from the nozzle 10. Since nothing that reflects the infrared radiations I is in a space surrounding the nozzle 10, the image of the space has a low lightness value Y0. The first infrared emitter 111a and the second infrared emitter 111b are disposed symmetrically with respect to the vertical axis of the nozzle 10 such that the angles γ and δ in a horizontal plane are in the range of 120° to 160°. Therefore, when the coating liquid R is sucked back into the passage 10e and an air-filled space is formed in part of the passage 10e near the tip 10d, the infrared radiations I emitted by the first infrared emitter 111a and the second infrared emitter 111b are reflected by the inner side surface of the air-filled part of the passage 10e and hence the picture of the air-filled part of the passage 10e has the highest lightness value Y4

The picture of the tubular part 10c irradiated with the infrared radiations I has a lightness value Y3 lower than the lightness value Y4. Only the infrared radiations I transmitted by the coating liquid R and the tubular part 10c among the infrared radiations I radiated toward the coating liquid R in the tubular part 10c reaches the camera 17A, the picture of the coating liquid R in the tubular part 10c has a low lightness value Y1.

The infrared emitters 111a and 111b are at a level higher than the predetermined level P of the surface R2 of the coating liquid R held in the passage 10e of the nozzle 10 while the coating liquid R is not being spouted from the nozzle 10 as shown in FIG. 12A. The angle β in a vertical plane is in the range of 120° to 160°. The surface R2 is irradiated with both the infrared radiation I directly fallen on the surface R2 and the infrared radiations I reflected from the wafer W. Therefore, the infrared radiations I that fall on the camera 17A has a high intensity because the same infrared radiations I include both the infrared radiations I reflected by the surface R2 of the coating liquid R in the passage 10e of the nozzle 10 and the refracted infrared radiations I. Therefore, the surface R2 of the coating liquid R in the passage 10e of the nozzle 10 can be highlighted and a clear image of the surface R2 of the coating liquid R in the passage 10e of the nozzle 10 can be formed. Thus, the picture of the surface R2 has the highest lightness value Y4.

FIG. 12B shows a picture equivalent to an image formed by the camera 17A while the coating liquid R is being spouted from the nozzle 10. The coating liquid R spouted from the nozzle 10 forms a coating liquid column R1 instantaneously between the tip 10d of the nozzle 10 and the surface W1 of the wafer W. The infrared radiations I transmitted by the coating liquid column R reach the camera 17A. Therefore, the picture of the coating liquid column R1 has a lightness value Y2 slightly higher than the lightness value Y1 of a picture equivalent to an image of the coating liquid R in the tubular part 10c formed by the infrared radiations transmitted by the coating liquid R in the tubular part 10c.

The angles γ and δ in a horizontal plane specifying the positions of the first infrared emitter 111a and the second infrared emitter 111b disposed symmetrically with respect to the vertical axis of the nozzle 10 are in the range of 120° to 160°. The first infrared emitter 111a and the second infrared emitter 111b emit the infrared radiations I toward an area between the tip 10d of the nozzle 10 and the surface W1 of the wafer W. Therefore, reflected infrared radiations and refracted infrared radiations respectively having high intensities travel from the side of the coating liquid column R1 formed between the tip 10d of the nozzle 10 and the surface W1 of the wafer W toward the camera 17A. Thus, the side of the coating liquid column R1 can be highlighted, and hence the picture of the side of the coating liquid column R1 has the highest lightness value Y4. Since a clear image of the side of the coating liquid column R1 can be formed, the side of the coating liquid column R can be stably highlighted and a clear picture of the coating liquid column R1 precisely showing the width of the coating liquid column R1 can be obtained.

Since the side of the coating liquid column R1 can be stably highlighted by disposing the infrared emitters 111a and 111b as mentioned above, the coating liquid column R1 can be easily observed, and risk of making a wrong decision on the basis of results of data obtained by processing the image can be reduced. Since a picture clearly showing the side in an edge can be obtained by processing the image by a simple process, image analyzing load on the controller is low, the processing capacity of the controller may be small, and hence the controller can be built by assembling inexpensive parts.

Figure 12:
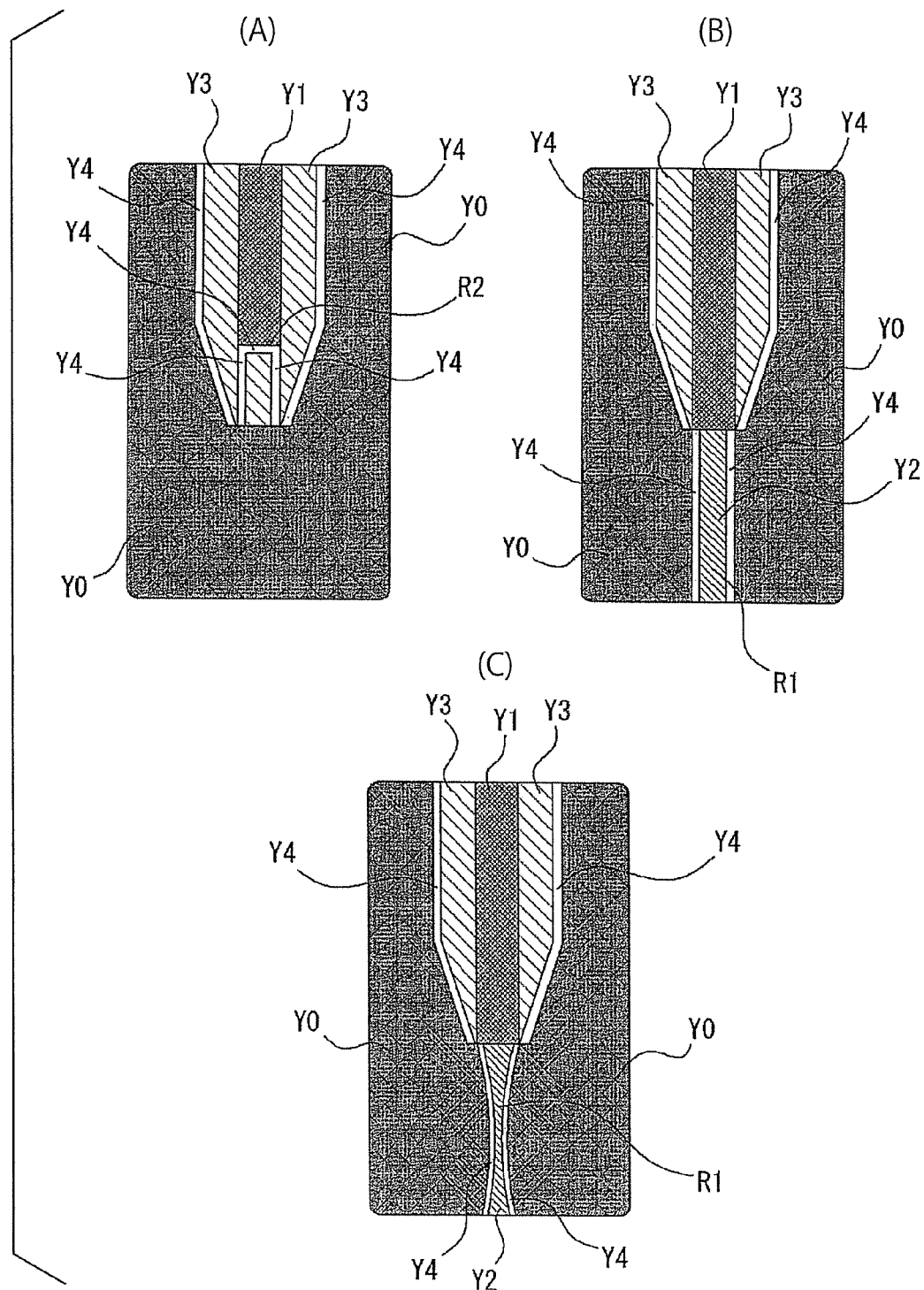
FIGS. 12A, 12B and 12C are pictures of an area including the processing liquid spouting nozzle of the second embodiment when processing liquid spouting is stopped normally, when the processing liquid is spouted normally, and when a column of the processing liquid narrowed, respectively, taken by a camera.
Figure 13:
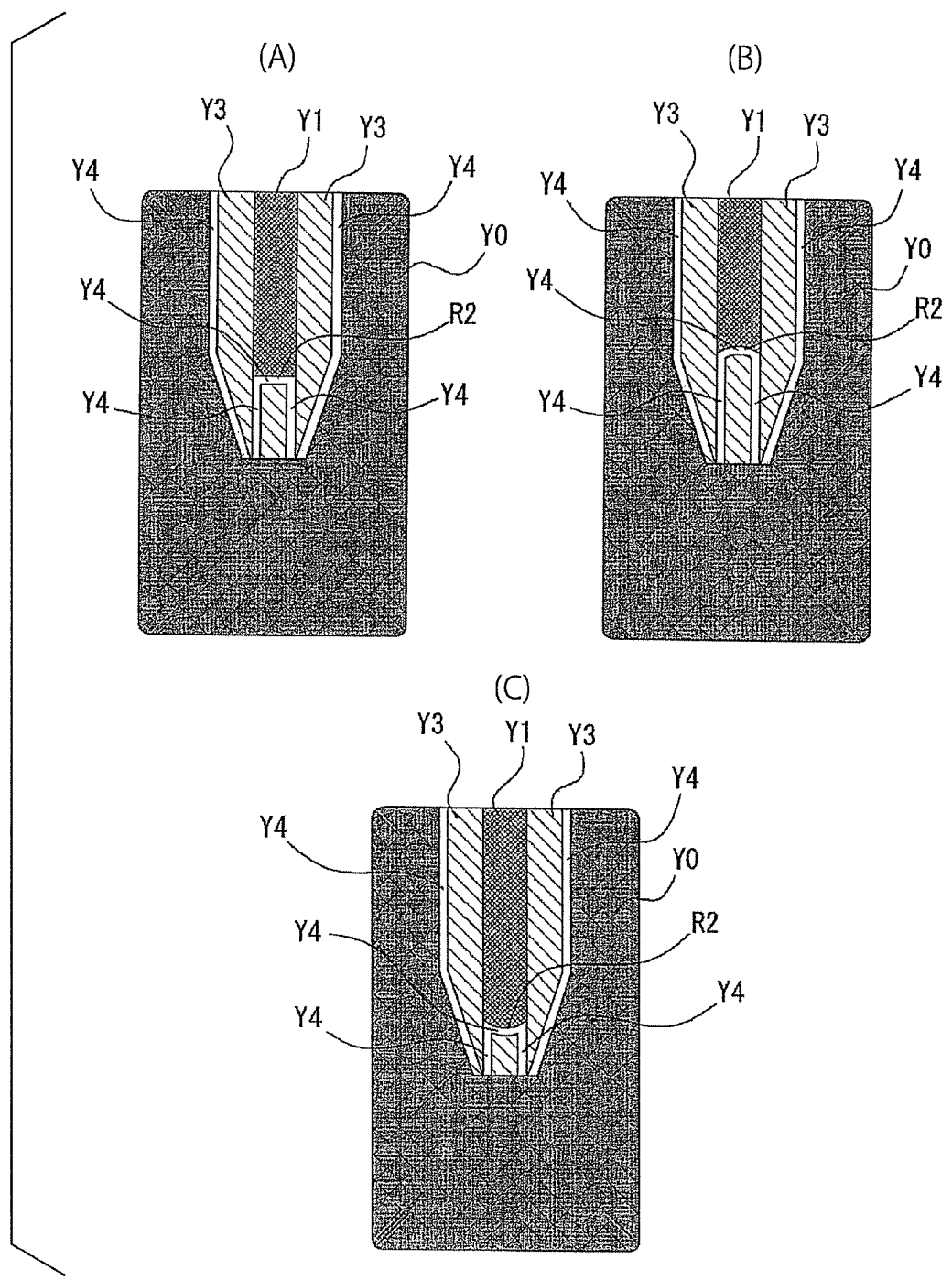
FIGS. 13A, 13B and 13C are pictures of an area including the processing liquid spouting nozzle of the second embodiment when processing liquid spouting is stopped normally, after the level of the surface of the processing liquid has risen, and after the level of the processing liquid has descended, respectively.

A decision procedure to be executed by the decision unit 9b will be described with reference to FIGS. 4, 6, 12 and 13. The decision unit 9b stores an image formed by the camera 17A while the coating liquid R is spouted normally from the nozzle 10, namely, reference data, in the storage device 95 when the operator gives an instruction to the controller 9. As mentioned above, when the coating liquid R is spouted by a normal spouting operation, a picture shown in FIG. 12A gives reference data on a normal spout stopping condition and a picture shown in FIG. 12B gives reference data on a normal spouting condition. The pictures shown in FIGS. 12A and 12B are stored as reference data in the storage device 95.

The decision unit 9b, which stores the reference data in the storage device 95, decides whether or not coating liquid R was spouted from the nozzle 10 and whether or not changes occurred in the condition of the coating liquid R spouted from the nozzle 10 on the basis of results of comparison of a picture equivalent to an image formed by the camera 17A and the reference data in terms of lightness.

The second embodiment executes the same procedure as that executed by the first embodiment. A spout signal opens the pneumatic valve 72 for a moment to spout the coating liquid R from the nozzle 10. The camera 17A forms an image of the spouting operation, and the image is given to the decision unit 9b in step S101. When the decision unit 9b receives a confirmation signal from the control unit 9a, i.e., if the response to a query made in step S102 is affirmative, the decision unit 9b analyzes the image and compares the image with the reference data, namely, a picture shown in FIG. 12B, stored in the storage device 95 in terms of lightness. If the comparison proved that the image is identical with the reference data, it is decided that the coating liquid R was spouted, i.e., the response to a query made in step S103 is affirmative. In this case, the decision unit 9b does not give any signal to the display console 8 and the procedure returns to step S101.

The camera 17A forms an image and gives the same to the decision unit 9b in step S101. If any confirmation signal is not received from the control unit 9a, i.e., the response to the query made in step S102 is negative, the decision unit 9b compares the image and the reference data, namely, the picture shown in FIG. 12A, in terms of lightness. If it is decided that the image is identical with the reference data, i.e., if the response to a query made in step S106 is affirmative, it is decided that the coating liquid R was not spouted from the nozzle 10. In this case, the decision unit 9b does not give any signal to the display console 8, the procedure returns to step S101 and the display console 8 remains displaying "NORMAL".

The camera 17A forms an image and gives the same to the decision unit 9b in step S101. If it is decided that the decision unit 9b received a conformation signal from the control unit 9a, i.e., the response to the query made in step S102 is affirmative, and the decision unit 9b analyzes the image and compares the image with the reference data, namely, the picture shown in FIG. 12B. If it is decided that the image is not identical with the reference data, i.e., if the response to the query made in step S103 is negative, and the analysis proved that the image is identical with the reference data, namely, the picture shown in FIG. 12A, it is decided in step S104 that the coating liquid R was not spouted from the nozzle 10. Then, the decision unit 9b gives the display console 8 a warning signal and makes the display console 8 display a warning, "ABNORMAL, NO SPOUTING" in step S105.

The coating unit in the second embodiment can decide whether or not the coating liquid R was spouted from the nozzle 10 as mentioned above, and can further decide whether or not changes occurred in the condition of the coating liquid R spouted from the nozzle 10.

If the coating liquid column R1 of the coating liquid R extending between the tip 10d of the nozzle 10 and the surface W1 of the wafer W narrows, a picture shown in FIG. 12C is obtained. Narrowing occurs when the suck-back valve 73 does not suck back the coating liquid R satisfactorily into the nozzle 10 and the coating liquid R drips down from the tip 10d of the nozzle 10. Narrowing occurs also when the coating liquid R is not spouted properly from the nozzle 10. Narrowing is a sign of dripping.

If the camera 17A forms an image equivalent to the picture shown in FIG. 12C in step S101, the decision unit 9b decides, after deciding in step S102 that the decision unit 9b received a confirmation signal from the control unit 9a, that the image is not identical with reference data, namely, the picture shown in FIG. 12A or 12B, that is, responses to queries made in steps S103 and S106 are negative. The decision unit 9b proceeds with image analysis. The decision unit 9b decides in step S104 that dripping or bubbling occurred on the basis of results of comparison of the image with a picture of a narrowed coating liquid column stored in the storage device 95 and comparison of the image and the reference data on the picture of the coating liquid column R1 in terms of width. In this case, the decision unit 9b gives a warning signal to the display console 8 in step S105 to make the display console 8 display a warning, "ABNORMAL, NARROWING".

The coating unit in the second embodiment can decide whether not changes occurred in the surface R2 of the coating liquid R in the passage 10e of the nozzle 10 on the basis of an image expressing the brightness of the coating liquid R in the passage 10e of the nozzle 10.

The suck-back valve 73 sucks back the coating liquid R through the tip 10e into the nozzle 10 to hold the surface R2 of the coating liquid R in the passage 10e of the nozzle 10 at a predetermined level P when a spouting operation is interrupted. If the suction of the suck-back valve 73 is excessively high and the surface R2 is raised beyond the predetermined level P, bubbles are liable to form in the coating liquid R when the coating liquid R is spouted and spouting operation will be mistimed.

FIG. 13A is a picture of reference data on a normal spout stopping condition, in which the surface R2 is held at the predetermined level P in the passage 10e of the nozzle 10. The infrared emitters 111a and 111b are at the level higher than the predetermined level P of the surface R2 of the coating liquid R held in the passage 10e of the nozzle 10 while the coating liquid R is not spouted from the tip 10d of the nozzle 10. The infrared emitters 111a and 111b are disposed such that the angle β in a vertical plane between the light path of infrared radiations from the infrared emitter 111a (111b) to the surface R2 of the coating liquid at the predetermined level P and the light path of reflected infrared radiations reflected from the surface R2 of the coating liquid R in the passage 10e of the nozzle 10 from the surface R2 to the camera 17A is in the range of 120° to 160°. Since the surface R2 is irradiated with both the infrared radiations I directly falling on the surface R2 and the infrared radiations I reflected from the wafer W toward the surface R2, the respective intensities of reflected infrared radiations and refracted infrared radiations traveling toward the camera 17A are high and the surface R2 of the coating liquid R in the passage 10e of the nozzle 10 can be highlighted. Thus, a picture of the surface R2 has the highest lightness value Y4. When the suction of the suck-back valve 73 is excessively high, the level of the surface R2 rises as shown in FIG. 13B and hence the position of a picture of the surface R2 having the lightness Y4 rises.

In a picture equivalent to reference data on a normal spout stopping condition shown in FIG. 13A, the surface R2 is flat. As shown in FIG. 13A, which is a picture of a condition in which the suction of the suck-back valve 73 is excessively high, the surface R2 has an upward convex shape. Such changes in the shape of the surface R2 can be recognized.

When the coating liquid R is sucked back into the passage 10e and an air-filled space is formed in part of the passage 10e near the tip 10d as shown in FIG. 13A, the inner side surface of the air-filled part of the passage 10e reflects the infrared radiations I and shines. Since the infrared emitters 111a and 111b are disposed such that the angle γ in a horizontal plane between the optical axis of the first infrared emitter 111a and the optical axis of the camera 17A and the angle δ in a horizontal plane between the optical axis of the second infrared emitter 111b and the optical axis of the camera 17A are in the range of 120° to 160°, and the infrared emitters 111a and 111b emit the infrared radiations I toward the nozzle 10, the surface R2 shines brightly. If the suction of the suck-back valve 73 is excessively high as shown in FIG. 13B, the surface R2 rises and the size of the air-filled space increases. Consequently, the length of the brightly shining part of the inner surface of the side of the passage 10e increases.

it is possible to know whether or not the surface R2 of the coating liquid R in the passage 10e of the nozzle 10 has changed through the examination of a shining part of the surface R2, the shape of the surface R2 and the brightness of the inner surface of the side of the passage 10e.

When the camera 17A forms an image equivalent to the picture shown in FIG. 13B in step S101, the decision unit 9b compares the image and the reference data shown in FIG. 13B in terms of lightness, analyzes the image and decides that the image is not identical with the reference data in step S103 (the response to the query made in step S103 is negative) after deciding in step S102 that the control unit 9a did not provide a confirmation signal (the response to the query made in step S102 is negative). The decision unit 9b further proceeds with image analysis to determine the shining part of the surface R2, the shape of the curved surface R2 and the length of a shining part of the inner surface of the side of the passage 10e, and compares the image with an image of the risen surface R2 stored beforehand in the storage device 95, and decides in step S104 that the surface R2 is risen. In this case, the decision unit 9b gives the display console 8 a warning signal to make the display console 8 display a warning, "ABNORMAL, SURFACE HAS RISEN" in step S105.

When the camera 17A forms an image equivalent to a picture shown in FIG. 13C in step S101, the decision unit 9b compares and analyzes the image and the reference data shown in FIG. 13A in terms of lightness and decides that the image is not identical with the reference data in step S103 (the response to the query made in step S103 is negative] after deciding in step S102 that the control unit 9a did not provide a confirmation signal (the response to the query made in step S102 is negative). The decision unit 9b further proceeds with image analysis to determine the shining part of the surface R2, the shape of the curved surface R2 and the length of a shining part of the inner surface of the side of the passage 10e, and compares the image with an image of the descended surface R2 stored beforehand in the storage device 95, and decides in step S104 that the surface R2 has descended. In this case, the decision unit 9b gives the display console 8 a warning signal to make the display console 8 display a warning, "ABNORMAL, SURFACE HAS DESCENDED" in step S105.

The infrared emitter 111 of the coating unit in the second embodiment, emits the infrared radiations I toward the area between the tip 10d of the nozzle 10 and the surface W1 of the wafer W. Therefore, the infrared radiations I penetrate into the coating liquid R spouted from the nozzle toward the wafer W and the infrared radiations I penetrated into the coating liquid R are reflected by the coating liquid R. The camera 17A can receive the infrared radiations I reflected from the coating liquid R and can form an image expressing the intensity of the reflected infrared radiations I. The decision unit 9b can decide whether or not the coating liquid R was spouted from the nozzle 10 and whether or not changes occurred in the condition of the coating liquid R spouted from the nozzle 10 on the basis of results of analysis of the image of the infrared radiations I reflected by the coating liquid R. Since the coating unit in the second embodiment can accurately decide whether or not the coating liquid R was spouted from the nozzle 10 and whether or not changes occurred in the condition of the coating liquid R spouted from the nozzle 10, increase in loss resulting from abnormal spouting of the coating liquid R from the nozzle 10 can be suppressed and loss of the coating liquid R can be limited to the least extent.

The infrared emitter 111 irradiates the nozzle 10 with the infrared radiations I, and the decision unit 9b can decide whether or not changes, such as rise or descent of the surface R2 of the coating liquid R in the passage 10e of the nozzle 10 from the predetermined level P and change in the shape of the surface R2, occurred in the surface R2 of the coating liquid R in the passage 10e of the nozzle 10 on the basis of results of analysis of an image expressing the brightness of the passage 10e of the nozzle 10. Therefore, increase in loss resulting from abnormal spouting of the coating liquid R from the nozzle 10 can be suppressed and the loss of the coating liquid R can be limited to the least extent.

In the coating unit in the second embodiment, the first infrared emitter 111a and the second infrared emitter 111b are disposed at a level higher than the predetermined level P of the surface R2 of the coating liquid R in the passage 10e of the nozzle 10 such that the angle β in a vertical plane between the light path of infrared radiations from the first infrared emitter 111a (the second infrared emitter 111b) to the surface R2 of the coating liquid R in the passage 10e of the nozzle 10 and the light path of reflected infrared radiations reflected from the surface R2 of the coating liquid R in the passage 10e of the nozzle 10 from the surface R2 to the camera 17A is in the range of 120° to 160°. The angle β specifying the respective positions of the first infrared emitter 111a and the second infrared embitter 111b may be properly changed so that the infrared radiations I irradiate only an area between the tip 10d of the nozzle 10 and the surface W1 of the wafer W.

Figure 14:
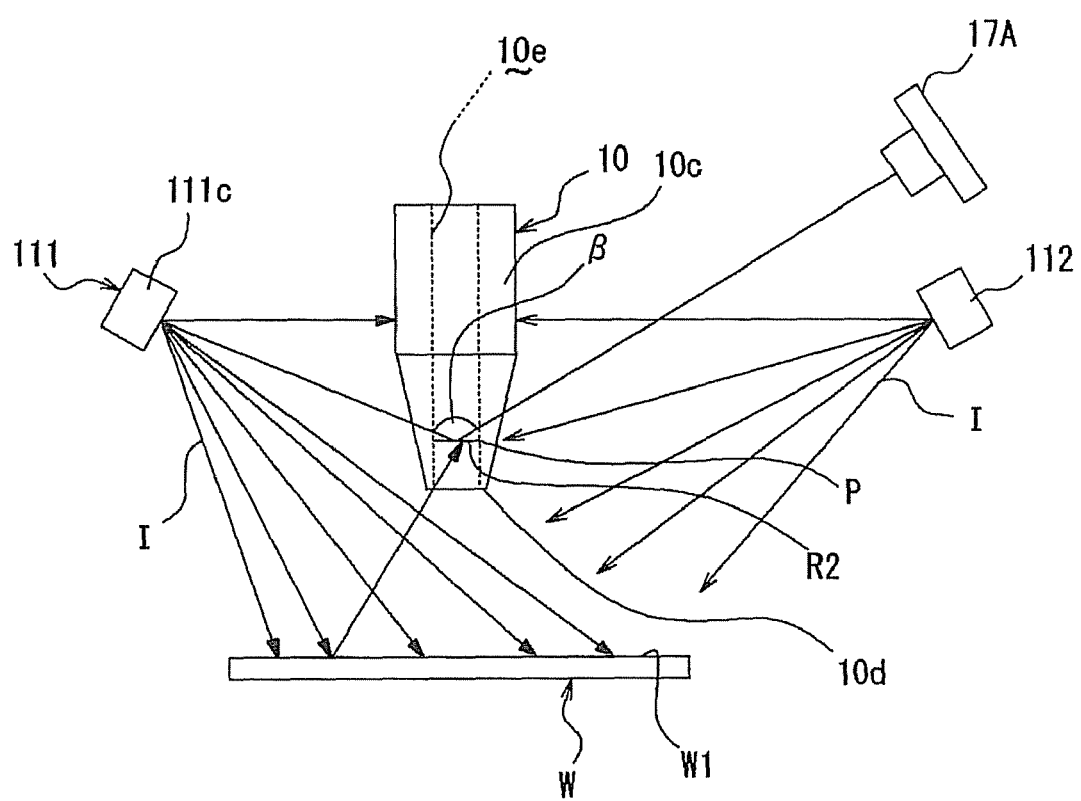
FIG. 14 is a schematic side elevation of a processing liquid spouting nozzle included in a coating unit in a third embodiment according to the present invention moved to a position above a wafer.

The coating unit in the second embodiment is provided with the two infrared emitters 111, namely, the first infrared emitter 111a and the second infrared emitter 111b. The first infrared emitter 111a and the second infrared emitter 111b are disposed symmetrically with respect to the vertical axis of the nozzle 10 such that the angles γ and δ in a horizontal plane are in the range of 120° to 160°. As shown in FIG. 14, an infrared emitter 111c and an auxiliary light source 112 may be used instead of the infrared emitters 111a and 111b. As shown in FIG. 14, the infrared emitter 111c may be disposed opposite, the camera 17A with respect to the nozzle 10, and the auxiliary light source 112 may be disposed opposite the infrared emitter 111c with respect to the nozzle 10.

When the infrared emitter 111c and the auxiliary light source 112 are used, the infrared emitter 111c is disposed opposite the camera 17A with respect to the nozzle 10 at a level higher than the predetermined level P of the surface R2 of the coating liquid R in the passage 10e of the nozzle 10 such that the angle β in a vertical plane between the light path of infrared radiations emitted by the infrared emitter 111c from the infrared emitter 111c to the surface R2 at the level P and the light path of infrared radiations reflected by the surface R2 at the level P from the surface R2 to the camera 17A is in the range of 120° to 160°.

The auxiliary light source 112 is, for example, an infrared LED light source. The auxiliary light source 112 is disposed opposite the infrared emitter 111c with respect to the nozzle 10. The auxiliary light source 112 can irradiate the nozzle 10, an area between the tip 10d of the nozzle 10 and the surface W1 of the wafer W, and the surface W1 of the wafer W with infrared radiations I.

When the infrared, emitter 111c and the auxiliary light source 112 are thus disposed, the surface of the coating liquid column R1 on the side of the camera 17A is irradiated by both the infrared emitter 111c and the auxiliary light source 112 to highlight the surface stably, so that the camera 17A can form an image in improved accuracy.

The infrared emitter 111c is disposed at the level higher than the level P of the surface R2 of the coating liquid R in the passage 10e of the nozzle 10 such that the angle β in a vertical plane is in the range of 120° to 160°. Therefore, the surface R2 is irradiated with infrared radiations directly fallen on the surface R2 of the coating liquid R in the passage 10e of the nozzle 10 and infrared radiations reflected from the wafer W. Therefore, reflected infrared radiations and refracted infrared radiations having high intensities travel to the camera 17A. Consequently, the surface R2 of the coating liquid R in the passage 10e of the nozzle 10 is irradiated sufficiently, the surface R2 of the coating liquid R can be stably highlighted and the camera 17A can form an image in improved accuracy.

The coating unit 1 will be described as applied to a coating and developing apparatus. The coating and developing apparatus has a carrier block S1. A transfer arm C takes out a wafer W from an airtight carrier 100 placed on a table 100a installed in the carrier block S1 and carries the wafer W to a processing block S2. The transfer arm C carries a processed wafer W from the processing block S2 and returns the processed wafer W to the carrier 100.

Figure 20:
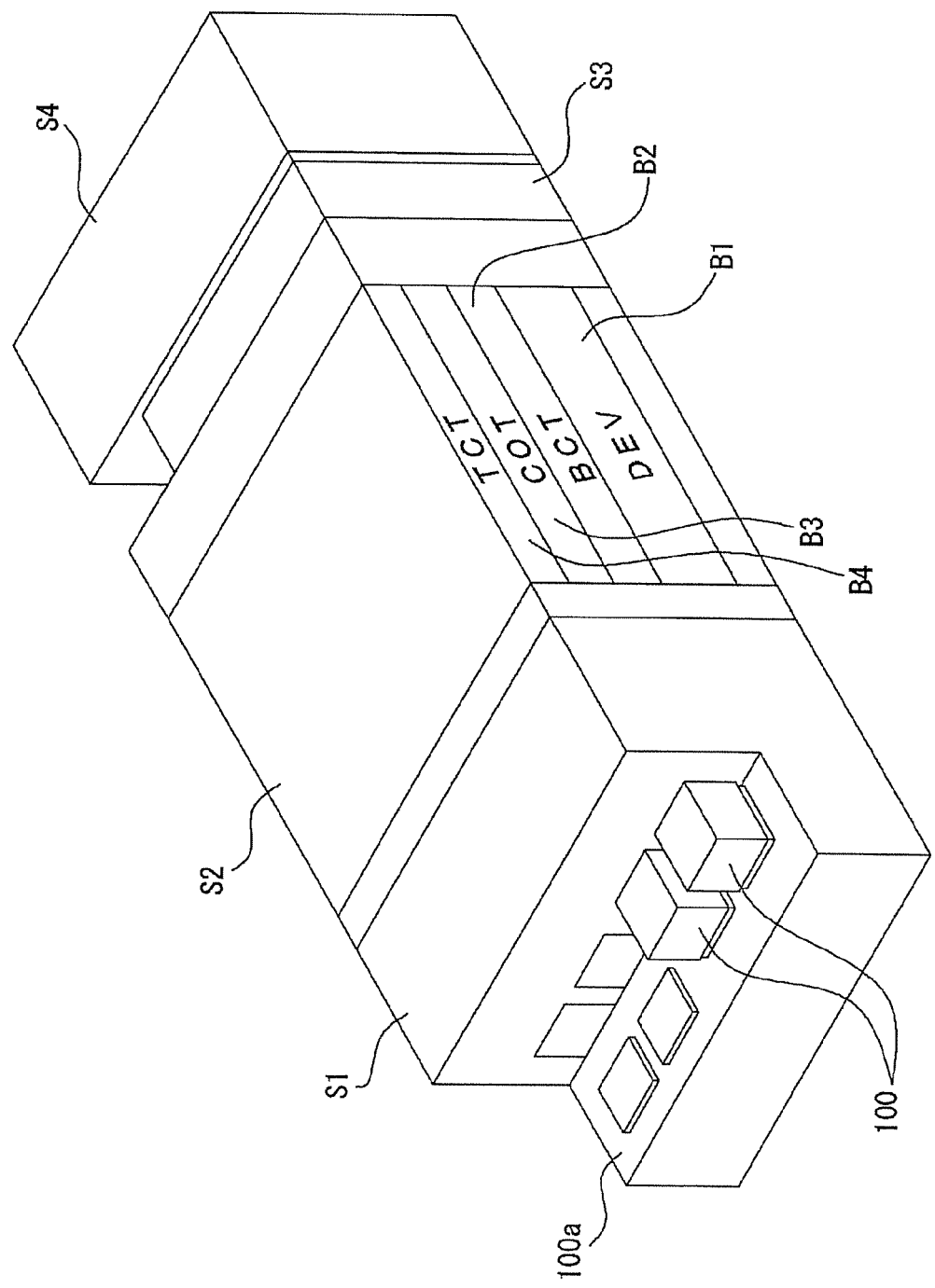
FIG. 20 is a schematic perspective view of the coating and developing system shown in FIG. 19.

Referring to FIG. 20, the processing block S2 has a first block B1 (DEV layer) that executes a developing process, a second block B2 (BCT layer) that forms an antireflection film beneath a resist film, a third block B3 (COT layer) that forms a resist film, and a fourth block B4 (TCT layer) that forms an antireflection film on a resist film. The first block B1, the second block B2, the third block B3 and the fourth block B4 are stacked up in layers in that order.

The second block 82 (BCT layer) and the fourth block B4 (TCT layer) are provided with coating units 1 embodying the present invention for forming an antireflection film on a wafer W by applying a chemical solution by spin coating to a surface of a wafer W, processing units for heating and cooling for a pretreatment process and a posttreatment process before and after, respectively, the coating process to be executed by the coating units 1, and carrying arms A2 and A4 each disposed between the coating unit 1 and the processing units to transfer a wafer W between each of the coating units 1 and each of the processing units. The third block B3 (COT layer) is the same in construction, except that the third block 83 uses a resist solution instead of the chemical solution.

Figure 21:
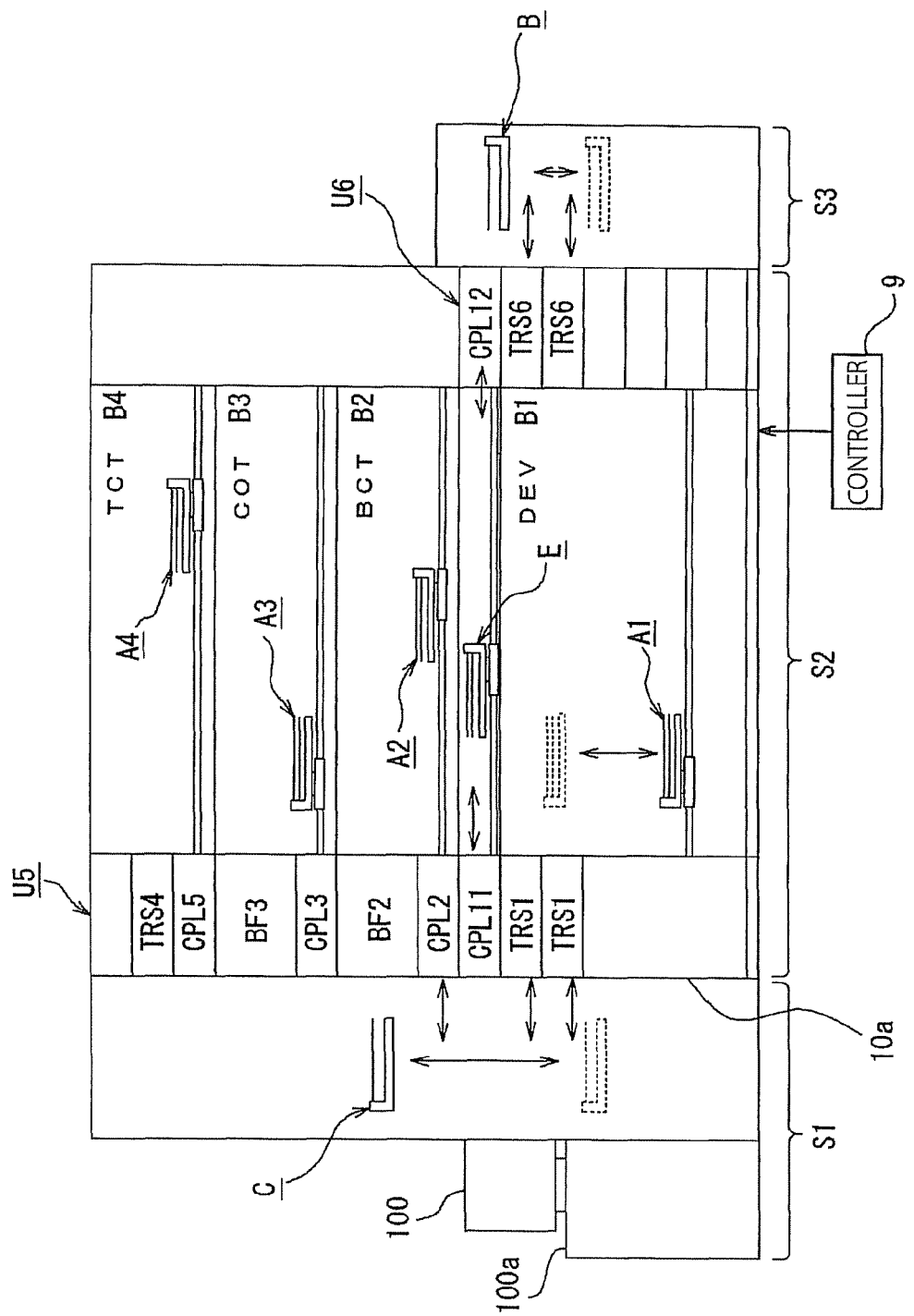
FIG. 21 is a schematic vertical sectional view of the coating and developing apparatus shown in FIG. 19.

Referring to FIG. 21, two developing units are stacked up in two layers in the first block 81 (DEV layer). The first block B1 is provided with a carrying arm A1 that carries a wafer W to the developing units stacked up in two layers. The carrying arm A1 operates for both the two developing units.

Figure 19:
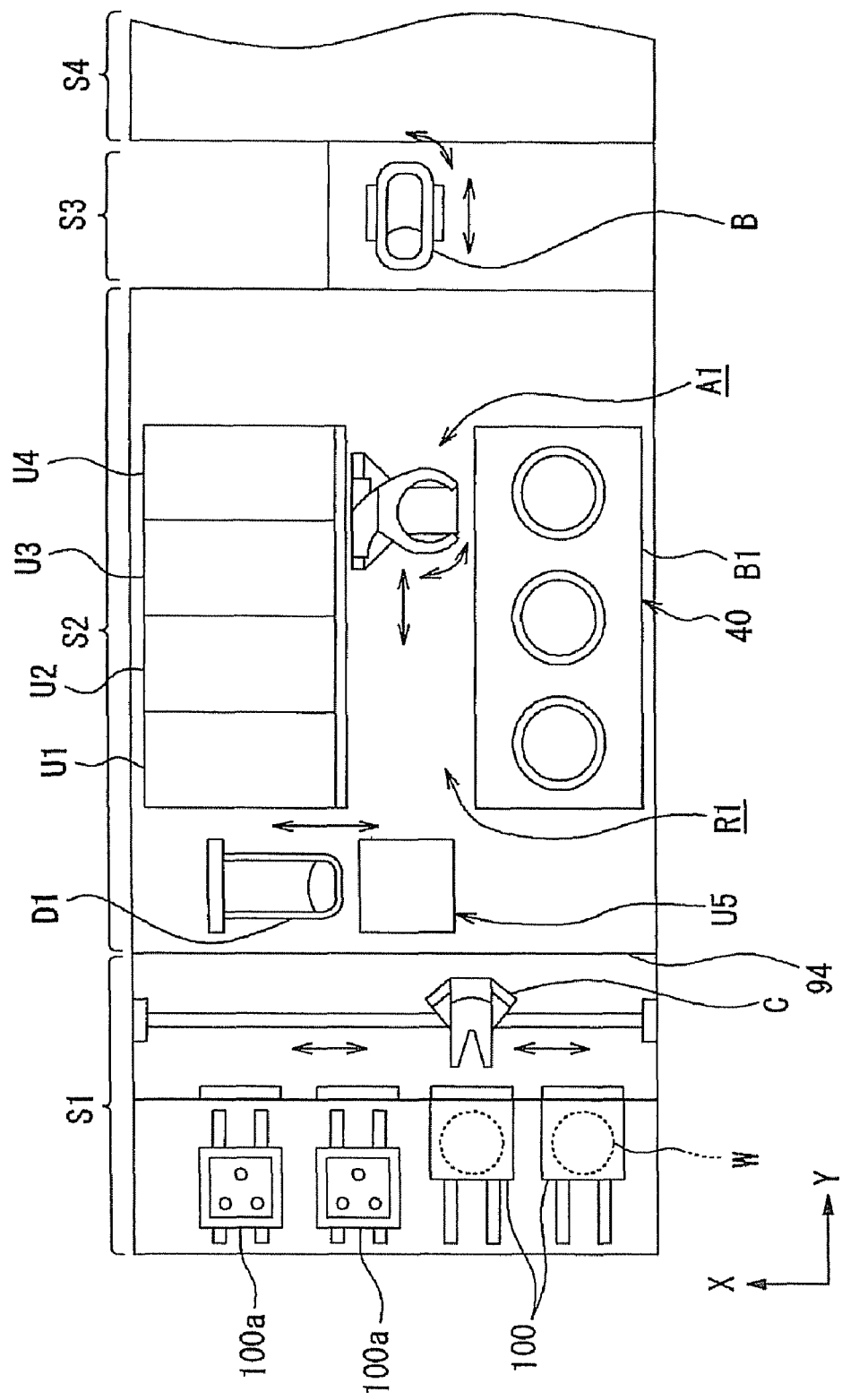
FIG. 19 is a schematic plan view of a coating and developing apparatus provided with the coating unit of the present invention.

As shown in FIGS. 19 and 20, a shelf unit U5 is installed in the processing block S2 and a first transfer arm D1 capable of moving in vertical directions is disposed near the shelf unit U5. The first transfer arm D1 transfers wafers W one by one from the carrier block S1 to a transfer unit in the shelf unit U5, such as a transfer unit CPL2 corresponding to the second block 82 (BCT layer). A carrying arm A2 installed in the second block 82 (BCT layer) carries the wafers W one by one from the transfer unit CPL2 to processing units, such as antireflection film forming units and heating and cooling units. Those processing units form an antireflection film on wafers W.

After an antireflection film has been formed on the wafer W, the transfer arm D1 transfers the wafer W from a transfer unit BF2 in the shelf unit U5 to a transfer unit CPL3 in the shelf unit U5, and a carrying arm A3 carries the wafer W from the transfer unit CPL3 of the shelf unit U5 to the third block 83 (COT layer). A resist film is formed on the wafer W in the third block B3 (COT layer). Then, the carrying arm A3 transfers the wafer W to a transfer unit BF3 in the shelf unit U5, and the transfer arm D1 transfers the wafer W to the transfer unit BF3 in the shelf unit U5. When necessary, an antireflection film is formed in the fourth block B4 (TCT layer) on the resist film formed on the wafer W. In such a case, the wafer W is transferred from a transfer unit CPL4 to the carrying arm A4 and, after an antireflection film has been formed on the wafer W, a carrying arm A4 carries the wafer W to the transfer unit TRS4.

A shuttle arm E is installed in an upper space in the DEV layer B1. The shuttle arm E is used exclusively for directly carrying a wafer W from a transfer unit CPL11 in the shelf unit U5 to a transfer unit CPL12 in a shelf unit U6. The transfer arm D1 transfers the wafer W coated with the resist film and the antireflection film from the transfer unit BF3 via the transfer unit TRS4 to the transfer unit CPL12. The shuttle arm E carries the wafer directly to the transfer unit CPL12 in the shelf unit U6, and then the wafer W is delivered to an interface block S3. In FIG. 21, transfer units denoted by "CPL" serve also as cooling units, and transfer units denoted by "BF" serve also as buffer units each capable of holding a plurality of wafers W.

Subsequently, an interface arm B carries the wafer W into an exposure system S4. After the wafer W has been processed by a predetermined exposure process, the wafer W is placed in a transfer unit TRS6 in the shelf unit U6, and then the wafer W is returned to the processing block S2. Then, the wafer W is subjected to a developing process in the first block B1 (DEV layer). The carrying arm A1 carries the wafer W processed by the developing process to a transfer unit TRS1 in the shelf unit U5. Then, the first transfer arm D1 transfers the wafer W from the transfer unit TRS1 to a transfer table within a range accessible by the transfer arm C, and the transfer arm C returns the wafer W to the carrier 100. In FIG. 19, indicated at U1 to U4 are thermal units each formed by stacking up heating units and cooling units.

Although the coating unit embodying the present invention has been described as applied to a coating and developing apparatus, the coating unit of the present invention is applicable also, for example, to a wet-processing apparatus for applying a processing solutions to the surface of a semiconductor wafer or a glass panel for a liquid crystal display, namely, an LCD panel, and to a single-wafer cleaning apparatus for cleaning wafers. The processing liquid mentioned herein is not limited to only a coating solution and may be, for example, a cleaning liquid or a developer.

What is claimed is:

1. A wet-processing apparatus that processes a substrate horizontally held by a substrate holder by a wet process that spouts processing liquids supplied by a processing liquid supply system onto a surface of the substrate, said wet-processing apparatus comprising:

processing liquid spouting nozzles respectively for spouting the processing liquids supplied by the processing liquid supply system;

a light source for illuminating an area between a plane containing tips of the processing liquid spouting nozzles and the surface of the substrate;

an imaging device for forming an image of at least the area between the plane containing the tips of the processing liquid spouting nozzles and the surface of the substrate in an area including the processing liquid spouting nozzles and the surface of the substrate;

a control unit that provides a spout signal requesting spouting the processing liquid from the processing liquid spouting nozzle toward the substrate, and an imaging signal requesting the imaging device to start an imaging operation; and a decision unit that decides whether or not the processing liquid was spouted from the processing liquid spouting nozzle and whether or not changes occurred in the condition of the processing liquid spouted from the processing liquid spouting nozzle on the basis of an image formed by the imaging device and expressing luminous intensity of light emitted by the light source, and penetrated into and reflected by the processing liquid spouted toward the substrate.

2. The wet-processing apparatus according to claim 1, wherein the light source emits light toward the surface of the substrate such that the light is reflected by the surface of the substrate and the reflected light illuminates the area between the plane containing the tips of the processing liquid spouting nozzles and the surface of the substrate.

3. The wet-processing apparatus according to claim 2, wherein the imaging device is disposed with its optical axis aligned with a light path of the reflected light reflected from a point of incidence of the light emitted by the light source on a processing liquid column in a direction at a reflection angle to a normal at the point of incidence on the processing liquid column equal to an incident angle to the normal at the point of incidence.

4. The wet-processing apparatus according to claim 1, wherein the light source emits light toward a position on the substrate where the processing liquid spouted from the processing liquid spouting nozzle falls.

5. The wet-processing apparatus according to claim 1, wherein the processing liquid spouting nozzles are tubular bodies made of a transparent material, and the imaging device is capable of forming an image expressing the brightness of the processing liquid in a passage formed in each processing liquid spouting nozzle.

6. The wet-processing apparatus according to claim 1 further comprising a storage device storing reference data to be used for deciding whether or not the processing liquid was spouted from the nozzle and whether or not changes occurred in the condition of the processing liquid spouted from the nozzle toward the substrate; wherein the decision unit decides whether or not the processing liquid was spouted from the nozzle and whether or not changes occurred in the condition of the processing liquid spouted from the nozzle toward the substrate on the basis of results of comparison of the image formed by the imaging device and the reference data in terms of lightness.

7. The wet-processing apparatus according to claim 6, wherein the reference data is an image of the processing liquid normally spouted from the processing liquid spouting nozzle formed by the imaging device.

8. The wet-processing apparatus according to claim 1 further comprising a nozzle carrying mechanism for carrying the processing liquid spouting nozzles to a position above the substrate held by the substrate holder, wherein the processing liquid spouting nozzles are arranged in a row parallel to a straight line, a single light source emits a flat light beam toward an area between the plane containing the tips of the processing liquid spouting nozzles and the surfaces of the substrates.

9. The wet-processing apparatus according to claim 1 further comprising a nozzle carrying mechanism for carrying the processing liquid spouting nozzles to a position above the substrate held by the substrate holder, wherein the processing liquid spouting nozzles are arranged in a row parallel to a straight line, and light sources respectively corresponding to the processing liquid spouting nozzles and arranged on a straight line parallel to the row of the processing liquid spouting nozzles emit light.

10. The wet-processing apparatus according to claim 1, wherein the light source includes a first light source and a second light source, and the first and the second light source are disposed symmetrically with respect to a vertical axis of the processing liquid spouting nozzle such that an angle in a horizontal plane between an optical axis of the imaging device and that of each of the first and the second light source is in the range of 120° to 160°.

11. The wet-processing apparatus according to claim 10, wherein the processing liquid spouting nozzles are tubular bodies made of a transparent material, and the imaging device is capable of forming an image expressing the brightness of the processing liquid in a passage formed in each processing liquid spouting nozzle.

12. The wet-processing apparatus according to claim 11, wherein the light source illuminates the processing liquid spouting nozzles also, and the decision unit decides whether or not there is any change in a level of a surface of the processing liquid in the passage of each processing liquid spouting nozzle on the basis of an image of the processing liquid in the passage of the processing liquid spouting nozzle formed by the imaging device and expressing the brightness of the processing liquid in the passage.

13. The wet-processing apparatus according to claim 12, wherein the light source is disposed at a level higher than a predetermined level of the processing liquid in the passage of the processing liquid spouting nozzle such that an angle in a vertical plane between an optical path of light from the light source to a point on the surface of the processing liquid at the predetermined level and a light path of reflected light from the same point on the surface of the processing liquid to the imaging device is in the range of 120° to 160°.

14. The wet-processing apparatus according to claim 1, wherein the imaging device and the light source are disposed opposite with respect to the row of the processing liquid spouting nozzles, and an auxiliary light source is disposed opposite the light source with respect to the row of the processing liquid spouting nozzle.

15. The wet-processing apparatus according to claim 14, wherein the processing liquid spouting nozzles are tubular bodies made of a transparent material, and the imaging device is capable of forming an image expressing the brightness of the processing liquid in a passage formed in each processing liquid spouting nozzle.

16. The wet-processing apparatus according to claim 15, wherein the light source illuminates the processing liquid spouting nozzles also, and the decision unit decides whether or not there is any change in a level of a surface of the processing liquid in the passage of each processing liquid spouting nozzle on the basis of an image of the processing liquid in the passage of the processing liquid spouting nozzle formed by the imaging device and expressing the brightness of the processing liquid in the passage.

17. The wet-processing apparatus according to claim 16, wherein the light source is disposed at a level higher than a predetermined level of the processing liquid in the passage of the processing liquid spouting nozzle such that an angle in a vertical plane between a light path of light from the light source to a point on the surface of the processing liquid at the predetermined level and a light path of reflected light from the same point on the surface of the processing liquid to the imaging device is in the range of 120° to 160°.

* * * * *